(12) United States Patent
Liu et al.

(10) Patent No.: US 12,507,505 B2
(45) Date of Patent: Dec. 23, 2025

(54) LIGHT-EMITTING DEVICE

(71) Applicant: EPISTAR CORPORATION, Hsinchu (TW)

(72) Inventors: Chia-Ming Liu, Hsinchu (TW); Chen Ou, Hsinchu (TW); Jing-Jie Dai, Hsinchu (TW); Shih-Wei Wang, Hsinchu (TW); Chih-Ciao Yang, Hsinchu (TW); Feng-Wen Huang, Hsinchu (TW); Dian-Ying Hu, Hsinchu (TW); Yu-Hsiang Yeh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 427 days.

(21) Appl. No.: 17/979,563

(22) Filed: Nov. 2, 2022

(65) Prior Publication Data
US 2023/0134581 A1    May 4, 2023

(30) Foreign Application Priority Data
Nov. 3, 2021    (TW) ................... 110140862

(51) Int. Cl.
*H10H 20/812*    (2025.01)
*F21K 9/232*    (2016.01)
(Continued)

(52) U.S. Cl.
CPC ...... *H10H 20/812* (2025.01); *H10H 20/8142* (2025.01); *H10H 20/815* (2025.01);
(Continued)

(58) Field of Classification Search
CPC .. H10H 20/812; H10H 20/841; H10H 20/825; H10H 20/833; H10H 20/8142; H10H 20/815; H10H 20/856; F21K 9/232
See application file for complete search history.

(56) References Cited

U.S. PATENT DOCUMENTS 9,608,161 B2 * 3/2017 Wang ..................... H10H 20/81
10,818,491 B2 * 10/2020 Zhao .................. H10D 62/8164
(Continued)

FOREIGN PATENT DOCUMENTS

CN    105428482 A    3/2016
JP    2008118049 A    5/2008

*Primary Examiner* — Mark W Tornow
(74) *Attorney, Agent, or Firm* — DITTHAVONG, STEINER & MLOTKOWSKI

(57) ABSTRACT

A light-emitting device includes a first nitride semiconductor structure; a stress relief structure on the first nitride semiconductor structure including a plurality of narrow band gap layers and a plurality of wide band gap layers alternately stacked, wherein one of the plurality of wide band gap layers includes a plurality of wide band gap sub-layers and one of the plurality of wide band gap sub-layers includes aluminum; an active structure on the stress relief structure including a plurality of quantum well layers and a plurality of barrier layers alternately stacked, wherein one of the plurality of barrier layers includes a plurality of barrier sub-layers and one of the plurality of barrier sub-layers includes aluminum, an aluminum composition of the wide band gap sub-layer is greater than or equal to that of the barrier sub-layer, and an average aluminum composition of the wide band gap layer is greater than that of the barrier layer; and an electron blocking structure on the active structure.

20 Claims, 7 Drawing Sheets

(51) Int. Cl.
*H10H 20/814* (2025.01)
*H10H 20/815* (2025.01)
*H10H 20/825* (2025.01)
*H10H 20/833* (2025.01)
*H10H 20/841* (2025.01)
*H10H 20/856* (2025.01)

(52) U.S. Cl.
CPC ........ *H10H 20/825* (2025.01); *H10H 20/833* (2025.01); *H10H 20/841* (2025.01); *H10H 20/856* (2025.01); *F21K 9/232* (2016.08)

(56) References Cited

U.S. PATENT DOCUMENTS

| | | |
|---|---|---|
| 2008/0308787 A1 | 12/2008 | Lee et al. |
| 2015/0083994 A1* | 3/2015 | Jain ...................... H10H 20/812 438/37 |
| 2017/0186905 A1* | 6/2017 | Shur ....................... C30B 25/04 |
| 2017/0256672 A1* | 9/2017 | Jain ...................... H10H 20/812 |

* cited by examiner

LIGHT-EMITTING DEVICE

CROSS-REFERENCE TO RELATED APPLICATIONS

This disclosure claims the right of priority of TW Application No. 110140862 filed on Nov. 3, 2021, and the content of which is hereby incorporated by reference in its entirety.

BACKGROUND

Technical Field

The present disclosure relates to a light-emitting device, and in particular to a light-emitting device comprising an active structure of quantum well layers and barrier layers which are composed of a nitride semiconductor material.

Description of the Related Art

Light-emitting diode (LED) is a solid-state semiconductor light-emitting device, which has the advantages of low power consumption, low heat generation, long lifetime, shockproof, small size, high response speed and good optical-electrical characteristics, such as stable emission wavelength. Therefore, light-emitting diodes have been widely applied in household appliances, equipment indicator lights, and optoelectronic products, and so forth.

SUMMARY

A light-emitting device comprises a first nitride semiconductor structure; a stress relief structure on the first nitride semiconductor structure comprising narrow band gap layers and wide band gap layers alternately stacked, wherein one of the wide band gap layers comprises wide band gap sub-layers and one of the wide band gap sub-layers comprises aluminum; an active structure on the stress relief structure comprising quantum well layers and barrier layers alternately stacked, wherein one of the barrier layers comprises barrier sub-layers and one of the barrier sub-layers comprises aluminum, an aluminum composition of the wide band gap sub-layer is greater than or equal to that of the barrier sub-layer, and an average aluminum composition of the wide band gap layer is greater than that of the barrier layer; and an electron blocking structure on the active structure.

DETAILED DESCRIPTION OF THE EMBODIMENTS

Figure 1:
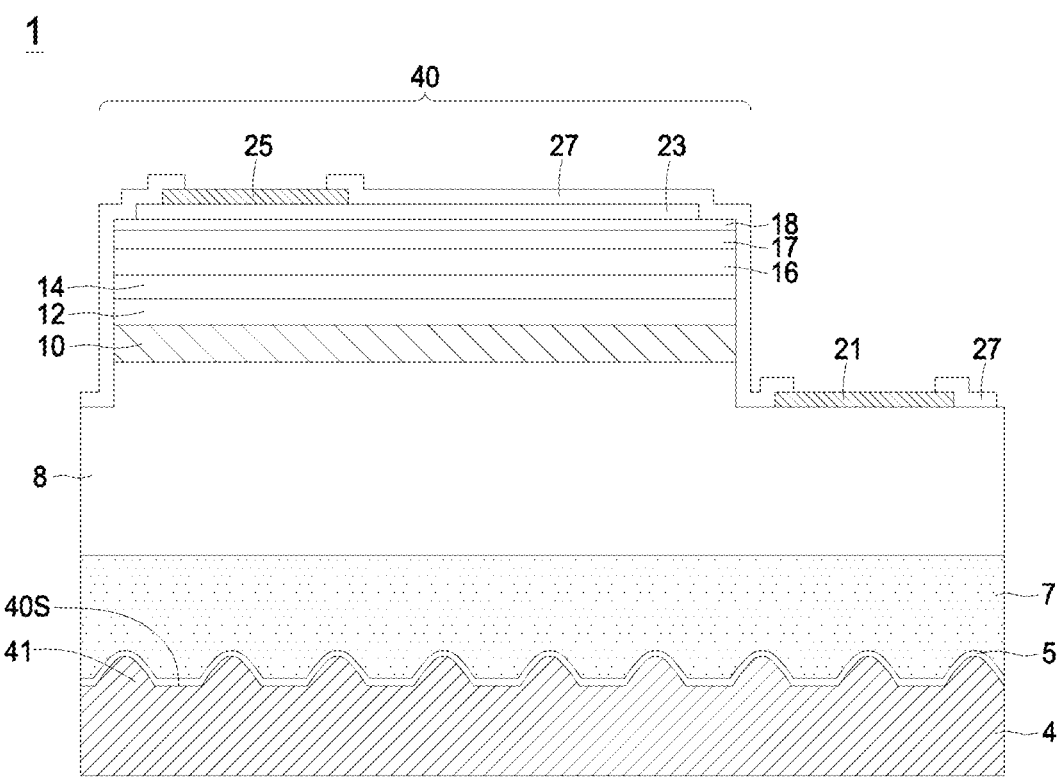
FIG. 1 shows a cross-sectional view of a light-emitting device 1 in accordance with an embodiment of the present disclosure.

In order to make the description of the present disclosure more detailed and complete, please refer to the description of the following embodiments with relevant figures. The embodiments shown below are for exemplifying the light-emitting device of the present disclosure, and the present disclosure is not limited to the following embodiments. In addition, the scope of the present disclosure is not limited thereto in the case that the dimensions, materials, shapes, relative arrangements, and so forth, of the constituent parts described in the embodiments of the present disclosure are not limited, which are merely for illustration. Furthermore, the sizes or positional relationships, and so forth, of the components shown in each of the figures may be enlarged for the sake of clarity. In addition, other layers/structures or steps may be incorporated in the following embodiments. For example, a description of "forming a second layer/structure on a first layer/structure" may comprise an embodiment which the first layer/structure directly contacts the second layer/structure, or an embodiment which the first layer/structure indirectly contacts the second layer/structure, namely other layers/structures exist between the first layer/structure and the second layer/structure. In addition, the spatial relative relationship between the first layer/structure and the second layer/structure may be varied depending on the operation or use of the apparatus, the first layer/structure itself is not limited to a single layer or a single structure, the first layer may comprise sub-layers, and the first structure may comprise layers. Furthermore, in the following description, in order to appropriately omit the detailed description, identical names and designations are used for the same or similar components.

Before describing the embodiments of the present disclosure, the following contents need to be described in advance. Firstly, in the present disclosure, $Al_xIn_yGa_{(1-x-y)}N$ represents that the chemical composition ratio of III group elements (the sum of Al, Ga and In) to N is 1:1, and Al, In and Ga of III group elements may be an arbitrary compound with a non-fixed composition ratio. $Al_xGa_{(1-x)}N$ represents that the chemical composition ratio of III group elements (the sum of Al and Ga) to N is 1:1, and Al and Ga of III group elements may be an arbitrary compound with a non-fixed composition ratio. In addition, if AlN (or GaN) is referred to, it means that Ga (or Al) is not included in AlN (or GaN), respectively. It is noted that compositions of Al, In or Ga in $Al_xIn_yGa_{(1-x-y)}N$ may be determined by known quantitative analysis, such as energy dispersive X-ray spectrometer (EDX) or X-ray diffractometer (XRD). In the present disclosure, $Al_xIn_yGa_{(1-x-y)}N$ as an example, the sum of Al, Ga, and In is 1. When a composition of Al is x, a composition of In is y, and a composition of Ga is (1-x-y).

In addition, in the present disclosure, a layer which electrically presents p-type characteristic is referred as a p-type layer, and a layer which electrically presents n-type characteristic is referred as an n-type layer. On the other hand, in the case that specific impurities such as magnesium (Mg), silicon (Si), and so forth, are not intentionally added to a layer and the layer does not electrically present a p-type or an n-type characteristic, the layer is referred as "i-type" or "undoped". The undoped layer may be mixed with unavoidable impurities during the manufacturing process. Specifically speaking, when the doping concentration is less than $1\times10^{17}/cm^3$, it is referred as "undoped" in the present disclosure. In addition, values of concentration of impurities such as magnesium (Mg) and silicon (Si), and so forth, are obtained by the analysis of secondary ion mass spectrometer (SIMS).

FIG. 1 is a cross-sectional view of a light-emitting device 1 in accordance with an embodiment of the present disclosure. The light-emitting device 1 comprises a substrate 4, a buffer structure 5, a base layer 7, an n-type nitride semiconductor structure 8, a periodic structure 10, a stress relief structure 12, an active structure 14, an electron blocking structure 16, a p-type nitride semiconductor structure 17 and a contact layer 18 sequentially stacked on an upper surface 40S of the substrate 4.

The light-emitting device 1 comprises a mesa 40, a portion of the n-type nitride semiconductor structure 8 is exposed outside the mesa 40, and an n-type electrode 21 is formed on the exposed portion. A p-type electrode 25 is formed on the p-type nitride semiconductor structure 17 and the contact layer 18. The transparent conductive layer 23 is formed between the p-type electrode 25 and the contact layer 18.

The substrate 4 has a thickness which is thick enough to support layers and structures thereon, such as not less than 30 μm, or not more than 300 μm. The substrate 4 comprises a sapphire ($Al_2O_3$) wafer, a gallium nitride (GaN) wafer, a silicon carbide (SiC) wafer or an aluminum nitride (AlN) wafer for the epitaxial growth of gallium nitride (GaN), indium gallium nitride (InGaN) or aluminum gallium nitride (AlGaN). The upper surface 40S in contact with the buffer structure 5 may be a roughened surface. The roughened surface may be a surface with an irregular morphology or a surface with a regular morphology. As shown in FIG. 1, the substrate 4 comprises one or more protrusions 41 protruding from the upper surface 40S, or comprises one or more recesses (not shown) recessed on the upper surface 40S. In a cross-sectional view, the protrusions 41 or the concave portions (not shown) may be in the shape of a hemisphere or a polygonal cone. In one embodiment, the protrusions 41 comprise a material different from that of the substrate 4, such as an insulating material or a conductive material. The semiconductor material comprises a compound semiconductor material, such as III-V group semiconductor materials, II-VI group semiconductor materials or silicon carbide (SiC). The insulating material comprises an oxide, a nitride, or an oxynitride. The oxide comprises silicon oxide, zinc oxide, aluminum oxide or titanium oxide. The nitride comprises silicon nitride, aluminum nitride or titanium nitride. The oxynitride comprises aluminum oxynitride. The conductive material comprises indium tin oxide. The protrusions 41 may be selected from a material which the refractive index thereof is between that of the substrate 4 and those of the semiconductor layers and the structures thereon to improve the light extraction efficiency of the light-emitting device 1. In other embodiments, the upper surface 40S in contact with the buffer structure 5 is a flat surface.

In one embodiment of the present disclosure, the buffer structure 5, the base layer 7, the n-type nitride semiconductor structure 8, the periodic structure 10, the stress relief structure 12, the active structure 14, the electron blocking structure 16, the p-type nitride semiconductor structure 17 and/or the contact layer 18 are formed on the substrate 4 with metal organic chemical vapor deposition (MOCVD), molecular beam epitaxy (MBE), hydride vapor deposition (HVPE), physical vapor deposition (PVD) or ion plating method, wherein the physical vapor deposition comprises sputtering or evaporation.

The buffer structure 5 is for reducing defects and improving the quality of the epitaxial layer grown thereon. The buffer structure 5 comprises a single layer or multiple layers (not shown). When the buffer structure 5 comprises multiple layers (not shown), the multiple layers comprise an identical material or different materials. In one embodiment, the buffer structure 5 comprises a first layer and a second layer, wherein the growth method of the first layer is sputtering, and the growth method of the second layer is metal organic chemical vapor deposition (MOCVD). In one embodiment, the buffer structure 5 further comprises a third layer, wherein the growth method of the third layer is metal organic chemical vapor deposition (MOCVD), and the growth temperature of the second layer is higher than or lower than the growth temperature of the third layer. In one embodiment, the first layer, the second layer and the third layer comprise identical materials such as aluminum nitride (AlN), or comprise different materials, such as an arbitrary combination of aluminum nitride (AlN), gallium nitride (GaN) and aluminum gallium nitride (AlGaN). In other embodiments, the buffer structure 5 comprises PVD-aluminum nitride (PVD-AlN). The target material for forming PVD-AlN is composed of AlN, or the target material composed of Al is used and is reactively formed aluminum nitride (AlN) in the environment of a nitrogen source.

In one embodiment, the buffer structure 5 may be undoped, namely unintentionally doped. In another embodiment, the buffer structure 5 may comprise a dopant, such as carbon (C), hydrogen (H), oxygen (O) or an arbitrary combination thereof, and the concentration of the dopant in the buffer structure 5 is not less than $1\times10^{17}/cm^3$.

The buffer structure 5 comprises $Al_xGa_{(1-x1)}N$ (0≤x1≤1), such as an AlN layer or a GaN layer. The thickness of the buffer structure 5 is not particularly limited and can be greater than or equal to 3 nm and less than or equal to 150 nm, and can be further greater than or equal to 5 nm and less than or equal to 80 nm.

The base layer 7 comprises $Al_{s1}In_{t1}Ga_{(1-s1-t1)}N$ (0≤s1≤1, 0≤t1≤1), $Al_{s1}Ga_{(1-s1)}N$ (0≤s1≤1), or a GaN layer. The base layer 7 can prevent crystal defects existed in the buffer structure 5 from propagating from the base layer 7 to the active structure 14. The base layer 7 may comprise an n-type impurity or not comprise an n-type impurity. When the base layer 7 does not comprise an n-type impurity, the crystallinity of the base layer 7 can be improved. Therefore, it is suitable that the base layer 7 does not comprise an n-type impurity to reduce the defects in the base layer 7. Furthermore, the defects in the base layer 7 can also be reduced by increasing the thickness of the base layer 7. If the thickness of the base layer 7 is increased above a certain level (for example, greater than 8 μm), the effect of the increase in the thickness of the base layer 7 corresponding to the defect reduction is saturated. Thus, the thickness of the base layer 7 can be greater than or equal to 2 μm and less than or equal to 8 μm, and can be less than or equal to 6 μm, or less than or equal to 4 μm alternatively. In one embodiment, when the substrate 4 comprises protrusions 41 protruding from the upper surface 40S of the substrate 4, the total thickness of the base layer 7 can be 0.5 µm thicker than the height of the protrusions 41 to completely cover the protrusions 41 and form a flat surface.

The n-type nitride semiconductor structure 8 comprises $Al_{s2}In_{t2}Ga_{(1-s2-t2)}N$ (0≤s2≤1, 0≤t2≤1) of an n-type impurity, or $Al_{s2}Ga_{(1-s2)}N$ of an n-type impurity (0≤s2≤1, 0≤s2≤0.1, or 0.001≤s2≤0.01 alternatively). The n-type nitride semiconductor structure 8 may be a single layer or layers which are formed by growth steps. The layers may have an identical composition or different compositions, and the layers may have an identical thickness or different thicknesses. In one embodiment, the n-type nitride semiconductor structure 8 comprises an n-type contact layer (not shown) and a modulation layer (not shown) located between the n-type contact layer and the base layer 7. A portion of the n-type contact layer is exposed outside the mesa 40, and the n-type electrode 21 may contact the n-type contact layer. The doping concentration of the n-type impurity of the n-type contact layer is the highest among the layers of the n-type nitride semiconductor structure 8, and is also higher than the n-type doping concentration of the base layer 7. The n-type contact layer may comprise a first n-type contact sub-layer and a second n-type contact sub-layer which are alternately stacked 7-40 times. The thickness of the n-type contact layer can be 0.4 µm-4 µm, 0.8 µm-3 µm, or 1 µm-2 µm alternatively, wherein the thicknesses of the first n-type contact sub-layer and the second n-type contact sub-layer are respectively 10 nm to 100 nm, 20 nm to 80 nm, or 30 nm to 70 nm in other embodiments. The first n-type contact sub-layer comprises $Al_xGa_{(1-x)}N$, wherein 0≤x<1, 0≤x<0.1, 0<x<0.05, 0<x<0.005, or x is substantially 0 alternatively. The second n-type contact sub-layer comprises $Al_yGa_{1-y}N$, wherein 0<y<1, 0<y≤0.1, 0<y≤0.05, 0<y≤0.01, or 0<y≤0.005 alternatively. In one embodiment, y>x. For example, the material of the first n-type contact sub-layer is gallium nitride (GaN), and the second n-type contact sub-layer is aluminum gallium nitride (AlGaN). The first n-type contact sub-layer comprises a higher n-type doping concentration and the second n-type contact sub-layer has a lower n-type doping concentration, which improves the lateral current dispersion and further enhances the anti-electrostatic discharge capability and luminous efficiency of the light-emitting device 1. The n-type doping concentration of the modulation layer is between the n-type contact layer and the base layer 7, and/or the lattice constant of the material of the modulation layer is between that of the n-type contact layer and that of the base layer 7, and/or the growth temperature of the modulation layer is between that of the n-type contact layer and that of the base layer 7, which is used to modulate the differences of doping concentration, materials, and growth condition parameters between the n-type contact layer and the base layer 7, so that the epitaxial defects of each layer above the modulation layer are reduced and the quality of the epitaxial layer can be improved. In one embodiment, the modulation layer comprises AlInGaN series materials, such as $Al_{z1}In_{z2}Ga_{(1-z1-z2)}N$, wherein 0≤z2<z1≤1. In another embodiment, the modulation layer comprises $Al_zGa_{1-z}N$, wherein 0≤z≤1. In another embodiment, when the n-type contact layer comprises $Al_yGa_{1-y}N$, the modulation layer comprises $Al_zGa_{1-z}N$, wherein y≤z≤0.1 or y≤z≤0.05 alternatively, wherein the thickness of the modulation layer is less than the thickness of the first n-type contact sub-layer and/or the thickness of the second n-type contact sub-layer, such as less than 10 nm.

The n-type impurity in the n-type nitride semiconductor structure 8 comprises silicon (Si), carbon (C) or germanium (Ge). The n-type doping concentration in the n-type nitride semiconductor structure 8 can be less than or equal to $5\times10^{19}$ cm$^{-3}$, or less than or equal to $2\times10^{19}$ cm$^{-3}$, and can be greater than or equal to $1\times10^{18}$ cm$^{-3}$, or greater than or equal to $4\times10^{18}$ cm$^{-3}$ alternatively. The greater the thickness of the n-type nitride semiconductor structure 8, the more its resistance is lowered. Accordingly, the thickness of the n-type nitride semiconductor structure 8 can be thickened. As the thickness of the n-type nitride semiconductor structure 8 is increased, the production cost is also increased. Therefore, from the standpoint of manufacturing, the thickness of the n-type nitride semiconductor structure 8 can be 1 µm-6 µm, 1.5 µm-4.5 µm, or 2 µm-3.5 µm alternatively.

Figure 3:
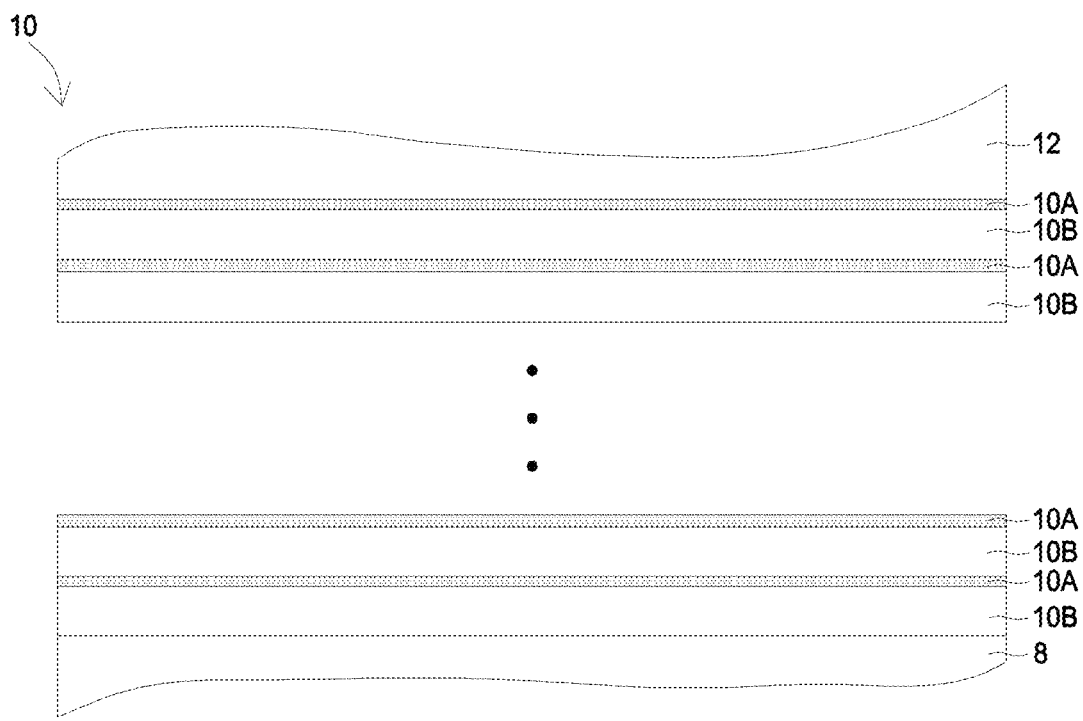
FIG. 3 shows a schematic structural view of the periodic structure 10.

As shown in FIG. 1, the periodic structure 10 is disposed between the n-type nitride semiconductor structure 8 and the active structure 14. FIG. 3 is a structural schematic view of the periodic structure 10.

As shown in FIG. 3, the periodic structure 10 may comprise several periods formed by alternately stacking first semiconductor layers 10A and second semiconductor layers 10B. The thickness of one period is the sum of the thickness of one first semiconductor layer 10A and the thickness of one second semiconductor layer 10B. In one embodiment, the thickness of one period in the periodic structure 10 is greater than the thickness of one period of the active structure 14 and the thickness of one period of the stress relief structure 12 described below. The thickness of the first semiconductor layer 10A is less than the thickness of the second semiconductor layer 10B. Specifically speaking, the first semiconductor layer 10A comprises a thickness between 0.5 nm and 8 nm, or between 1 nm and 3 nm alternatively, and the second semiconductor layer 10B comprises a thickness between 10 nm and 60 nm, or between 20 nm and 50 nm in other embodiments. The first semiconductor layer 10A comprises $In_{t3}Ga_{(1-t3)}N$ (0<t3<1), wherein 0.005<t3<0.1 or 0.01<t3<0.05 alternatively. The second semiconductor layer 10B can be $In_{t4}Ga_{(1-t4)}N$ (0≤t4<1, t4<t3), or a GaN layer not comprising indium (In) in other embodiments. The number of periods in which the first semiconductor layers 10A and the second semiconductor layers 10B are alternately stacked may be, for example, 2 to 20, 3 to 15 or 4 to 10 alternatively.

The first semiconductor layer 10A and/or the second semiconductor layer 10B comprises an n-type impurity or is undoped. In one embodiment, if the first semiconductor layer 10A and the second semiconductor layer 10B are both undoped or the doped n-type impurity concentrations thereof are too low, the driving voltage of the light-emitting device can be increased. Therefore, at least one of the first semiconductor layer 10A and the second semiconductor layer 10B comprises an n-type impurity. In one embodiment, when the n-type doping concentration of the periodic structure 10 is too high, the film quality of the periodic structure 10 is deteriorated, which further affects the film quality of the active structure 14 formed on the periodic structure 10 so the luminous efficiency of the active structure 14 may also be reduced accordingly. In one embodiment, the n-type doping concentration in the periodic structure 10 is less than the n-type doping concentration in the n-type nitride semiconductor structure 8. In one embodiment, the n-type doping concentration in the periodic structure 10 can be one-tenth of the n-type doping concentration in the n-type nitride semiconductor structure 8 or can be one-half of the n-type doping concentration of the n-type nitride semiconductor structure 8. In one embodiment, the n-type doping concentration of the periodic structure 10 can be less than $5\times10^{18}$ cm$^{-3}$ but greater than or equal to $1\times10^{17}$ cm$^{-3}$. In one embodiment, the first semiconductor layer 10A comprising indium (In)

does not comprise an n-type impurity, and the second semiconductor layer 10B which does not comprise indium (In) comprises an n-type impurity. The first semiconductor layer 10A of the periodic structure 10 comprises $In_{t3}Ga_{(1-t3)}N$ (0<t3<1) not doped with an n-type impurity and the second semiconductor layer 10B comprises GaN doped with an n-type impurity. When the periodic structure 10 comprises indium (In), the composition of indium (In) in the periodic structure 10 can be higher than that in the n-type nitride semiconductor structure 8 and lower than those in the stress relief structure 12 and the active structure 14 described below, so that the epitaxial lattice relaxes smoothly from the n-type nitride semiconductor structure 8 to the active structure 14.

Although FIG. 3 illustrates the second semiconductor layer 10B as the lowermost layer and the first semiconductor layer 10A as the uppermost layer, the lowermost layer of the periodic structure 10 may also be the first semiconductor layer 10A and the uppermost layer is the second semiconductor layer 10B.

Figure 4:
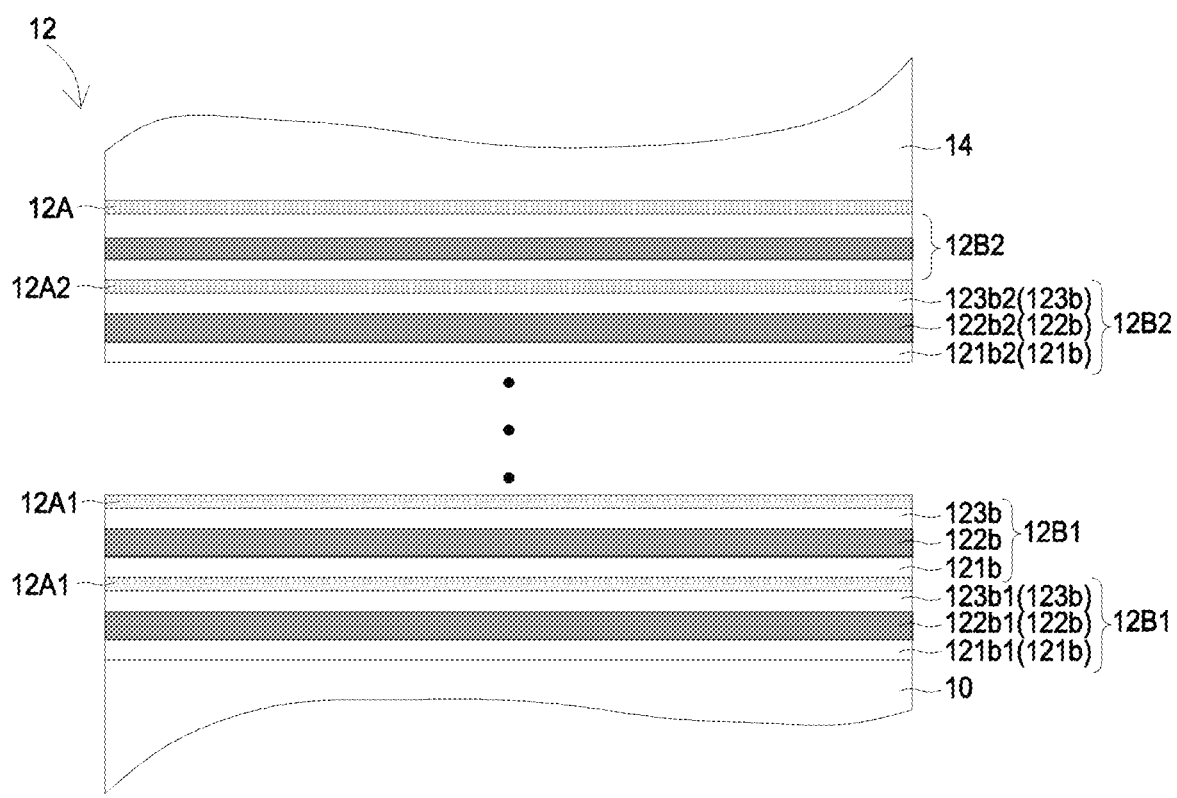
FIG. 4 shows a schematic structural view of the stress relief structure 12.
Figure 5:
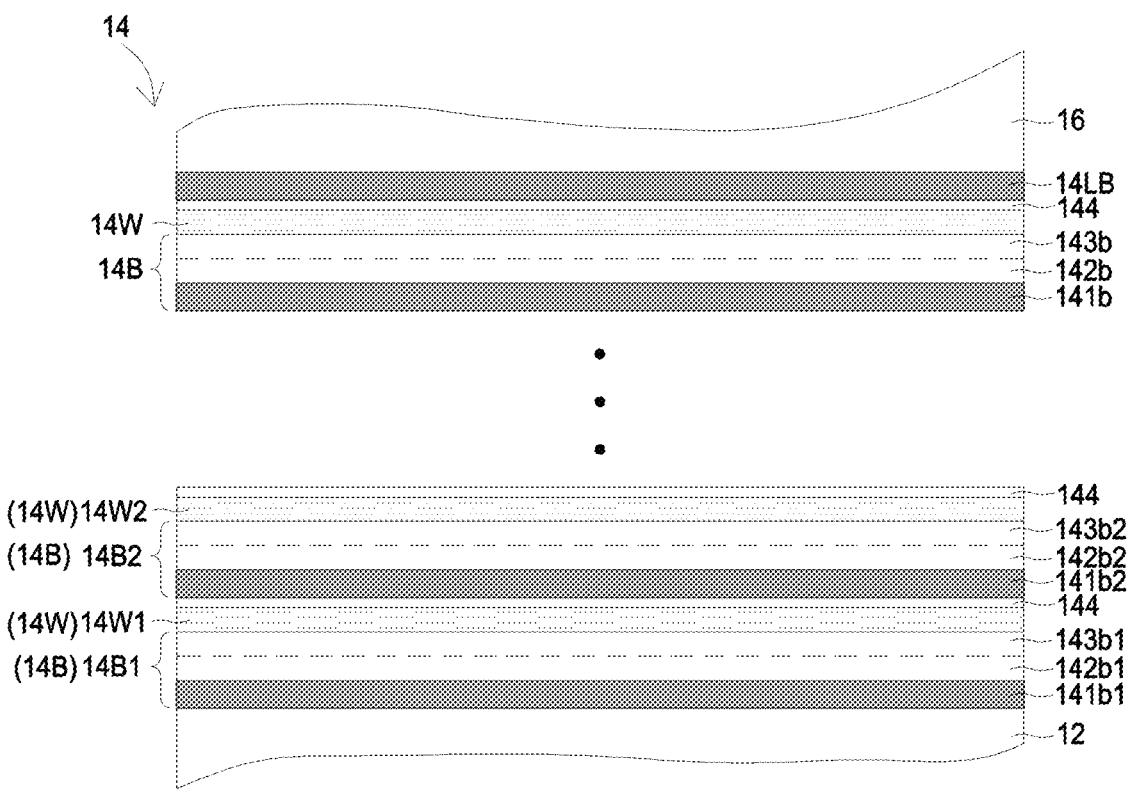
FIG. 5 shows a schematic structural view of the active structure 14.

As shown in FIG. 1, the stress relief structure 12 is disposed between the active structure 14 and the n-type nitride semiconductor structure 8. FIG. 4 is a structural schematic view of the stress relief structure 12. FIG. 5 is a structural schematic view of the active structure 14.

The lattice mismatch between InGaN quantum well layer and GaN barrier layer of the active structure 14 can affect the epitaxial quality of the active structure 14, so the stress relief structure 12 is grown before the active structure 14 to reduce lattice defects. Since the mobility of electrons is much faster than that of electron holes, electrons are uniformly distributed in the active structure 14. The distribution of electron holes gradually decreases from a side close to the p-type nitride semiconductor structure 17 to another side away from the p-type nitride semiconductor structure 17, causing that a portion of electrons cannot be radiatively recombined with electron holes to emit light so the luminous efficiency of the LED is reduced accordingly. In the present disclosure, the radiative recombination efficiency of electron holes and electrons in the active structure 14 is increased by adjusting the band gaps of the stress relief structure 12, the active structure 14 and the electron blocking structure 16.

As shown in FIG. 4, the stress relief structure 12 comprises several periods formed by alternately stacking narrow band gap layers 12A and wide band gap layers 12B. The thickness of one period is the sum of the thickness of one narrow band gap layer 12A and the thickness of one wide band gap layer 12B, which is less than the thickness of one period of the active structure 14 described below and less than the thickness of one period of the periodic structure 10 described above. The thickness of the narrow band gap layer 12A is less than that of the wide band gap layer 12B. Specifically speaking, the narrow band gap layer 12A comprises a thickness between 1 nm and 3 nm, and the wide band gap layer 12B comprises a thickness between 4 nm and 12 nm, or between 6 nm and 10 nm alternatively. The band gap of the wide band gap layer 12B is greater than that of the narrow band gap layer 12A. Specifically speaking, the narrow band gap layer 12A comprises $Al_{s5}In_{t5}Ga_{(1-s5-t5)}N$ (0≤s5<1, 0<t5<1) or $In_{t5}Ga_{(1-t5)}N$ (0<t5<1, or 0<t5≤0.1 alternatively). The wide band gap layer 12B comprises $Al_{s6}In_{t6}Ga_{(1-s6-t6)}N$ (0≤s6<1, 0≤t6<1, t6<t5, s5<s6), such as an $Al_{s6}Ga_{(1-s6)}N$ layer and/or a GaN layer, wherein 0<s6≤0.08 or 0<s6≤0.05 in other embodiments. The number of periods in which the narrow band gap layers 12A and the wide band gap layers 12B are alternately stacked may be, for example, 2 to 10, 3 to 8, or 4 to 6 in other embodiments.

Figure 2:
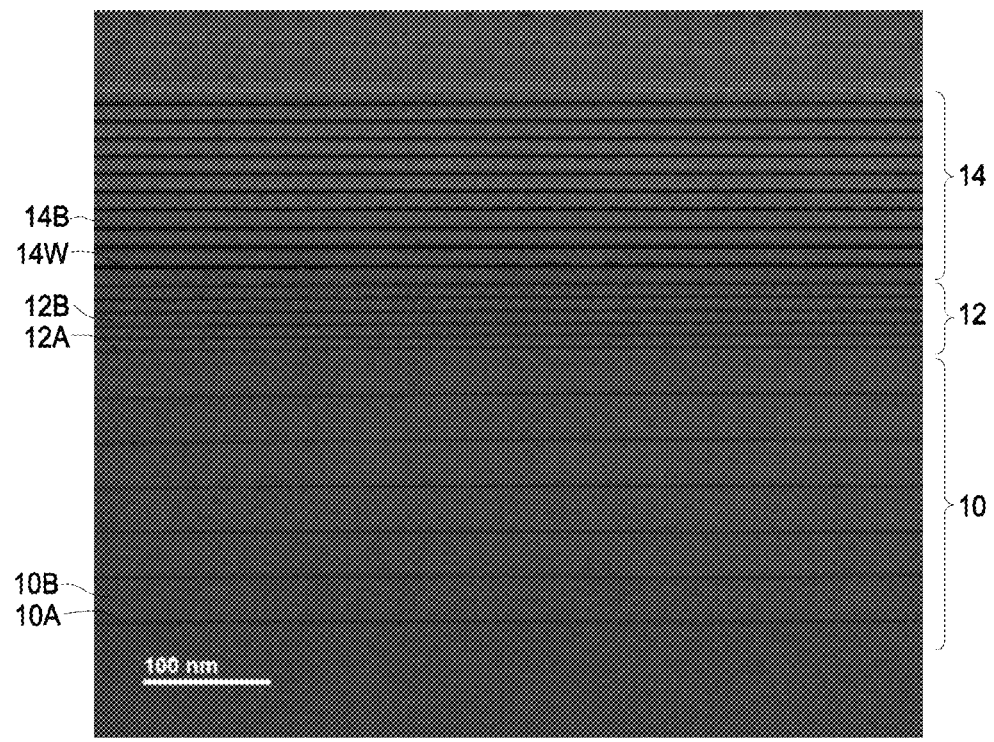
FIG. 2 shows a transmission electron microscope (TEM) image of a portion of the light-emitting device 1 in accordance with an embodiment of the present disclosure.

The narrow band gap layers 12A comprises a first narrow band gap layer 12A1 and a second narrow band gap layer 12A2. The wide band gap layers 12B comprise a first wide band gap layer 12B1 and a second wide band gap layer 12B2. In one growth direction of the stress relief structure 12, the numbers of the period formed by the first wide band gap layer 12B1 and the first narrow band gap layer 12A1 and the period formed by the second wide band gap layer 12B2 and the second narrow band gap layer 12A2 are respectively exemplified as one, but not limited to the number exemplified in the figures. For example, the period formed by the first wide band gap layer 12B1 and the first narrow band gap layer 12A1 may be two or more, and the first wide band gap layers 12B1 and the first narrow band gap layers 12A1 may be alternately stacked to form a first group of stress relief structures 12. The period formed by the second wide band gap layer 12B2 and the second narrow band gap layer 12A2 may be two or more, and the second wide band gap layers 12B2 and the first narrow band gap layers 12A2 may be alternately stacked to form a second group of the stress relief structures 12. In one embodiment, the number of periods and/or the total thickness of the narrow band gap layer 12A and the wide band gap layer 12B is not greater than the number of periods and/or the total thickness of the active structure 14 described below, so the light emitted from the active structure 14 is not absorbed and the light extraction efficiency of the light-emitting device 1 is not lowered. As shown in FIG. 2, in one embodiment, the stress relief structure 12 comprises a total thickness between 30 nm and 100 nm, which is less than the total thickness of the active structure 14 and less than the total thickness of the periodic structure 10.

One of the wide band gap layers 12B comprises wide band gap sub-layers. In the present embodiment, each of the wide band gap layers 12B comprises a first wide band gap sub-layer 121b, a second wide band gap sub-layer 122b and a third wide band gap sub-layer 123b, wherein the second wide band gap sub-layer 122b is located between the first wide band gap sub-layer 121b and the third wide band gap sub-layer 123b. The band gap of the second wide band gap sub-layer 122b is greater than that of the first wide band gap sub-layer 121b and that of the third wide band gap sub-layer 123b. The first wide band gap sub-layer 121b and the third wide band gap sub-layer 123b may comprise GaN. The second wide band gap sub-layer 122b comprises $Al_{s6}Ga_{(1-s6)}N$, while 0<s6<1, 0<s6≤0.08, or 0<s6≤0.05.

In another embodiment, the wide band gap layers 12B further comprises a cladding layer (not shown) composed of GaN contacting the narrow band gap layer 12A and an intermediate sub-layer (not shown) located between the cladding layer and the first wide band gap sub-layer 121b. The intermediate sub-layer comprises a lattice constant less than that of other sub-layers of the wide band gap layer 12B, and may be formed of a ternary compound semiconductor or a binary compound semiconductor having Al and N, such as AlGaN or AlN. In one embodiment, an intermediate sub-layer is formed after each of the narrow band gap layers 12A is formed, and the compressive stress of the narrow band gap layer 12A is compensated by adjusting the thickness of the intermediate sub-layer. The intermediate sub-layer comprises a thickness less than those of other sub-layers of the wide band gap layer 12B, such as 1 Å to 30 Å.

The first wide band gap sub-layer 121b and the third wide band gap sub-layer 123b respectively comprise a thickness less than that of the second wide band gap sub-layer 122b. The first wide band gap sub-layer 121b, the second wide band gap sub-layer 122b and the third wide band gap sub-layer 123b respectively have a thickness greater than 1 nm but less than 5 nm. A thickness of the second wide band gap sub-layer 122b and a thickness of the wide band gap layer 12B have a first thickness ratio between 45% and 55%. In one embodiment, the second wide band gap sub-layer 122b comprising $Al_{s6}Ga_{(1-s6)}N$ is closer to the n-type nitride semiconductor structure 8 than the third wide band gap sub-layer 123b comprising GaN to block electrons in advance. The sum of a thickness of the first wide band gap sub-layer 121b and a thickness of the second wide band gap sub-layer 122b is greater than or less than a thickness of the third wide band gap sub-layer 123b. In one embodiment, the first wide band gap sub-layer 121b and the third wide band gap sub-layer 123b comprise approximately identical or different thicknesses.

The wide band gap layer 12B may comprise layers, wherein the second wide band gap layer 12B2 closer to the active structure 14 has a thickness greater than that of the first wide band gap layer 12B1 away from the active structure 14, but the difference between a thickness of the first wide band gap layer 12B1 and a thickness of the second wide band gap layer 12B2 is not greater than 3 nm, or not greater than 2 nm alternatively. The narrow band gap layers 12A, such as the first narrow band gap layer 12A1 away from the active structure 14 and the second narrow band gap layer 12A2 close to the active structure 14, may comprise approximately identical thicknesses.

In the present embodiment, the first wide band gap sub-layer 121b is closer to the n-type nitride semiconductor structure 8 than the second wide band gap sub-layer 122b, and the second wide band gap sub-layer 122b is closer to the n-type nitride semiconductor structure 8 than the third wide band gap sub-layer 123b. The first wide band gap sub-layer 121b and the third wide band gap sub-layer 123b respectively contact two opposite sides of the narrow band gap layer 12A. Doping an n-type impurity into the wide band gap layer 12B can improve the injection efficiency of electrons. At least one of the first wide band gap sub-layer 121b and the third wide band gap sub-layer 123b comprises an n-type impurity, and the n-type impurity can be silicon (Si). In one embodiment, the n-type impurity can be doped before the narrow band gap layer 12A is formed. For example, an n-type impurity is doped into the third wide band gap sub-layer 123b, which is formed before the narrow band gap layer 12A is formed and is in direct contact with the narrow band gap layer 12A. The n-type doping concentration of the first wide band gap sub-layer 121b and/or the third wide band gap sub-layer 123b can be less than $1\times10^{18}$ $cm^{-3}$ but greater than or equal to $1\times10^{17}$ $cm^{-3}$. When the n-type doping concentration of the first wide band gap sub-layer 121b and/or the third wide band gap sub-layer 123b is too high, the film quality of the stress relief structure 12 is easily deteriorated, and the film quality in the active structure 14 formed on the stress relief structure 12 may also be deteriorated. Therefore, the n-type doping concentration in the stress relief structure 12 is less than the n-type doping concentration in the n-type nitride semiconductor structure 8. The n-type doping concentration of the stress relief structure 12 can be one-tenth of the n-type doping concentration in the n-type nitride semiconductor structure 8.

As shown in FIGS. 1 and 2, the active structure 14 is disposed on the stress relief structure 12. FIG. 5 is a structural schematic view of the active structure 14. The active structure 14 comprises several periods formed by alternately stacking quantum well layers 14W and barrier layers 14B. The thickness of one period is the sum of the thickness of one quantum well layer 14W and the thickness of one barrier layer 14B. The thickness of the barrier layer 14B is 2-10 times the thickness of the quantum well layer 14W. Specifically speaking, the quantum well layer 14W comprises a thickness between 2 nm and 4 nm, and the barrier layer 14B comprises a thickness between 4 nm and 40 nm, or between 6 nm and 20 nm alternatively. The band gap of the barrier layer 14B is greater than the band gap of the quantum well layer 14W. The quantum well layer 14W comprises indium (In), such as $Al_{s7}In_{t7}Ga_{(1-s7-t7)}N$ ($0 \leq s7 \leq 1$, $0 < t7 \leq 1$), or $In_{t7}Ga_{(1-t7)}N$ wherein $0.1 < t7 < 0.25$. The barrier layer 14B comprises a nitride layer, and the composition ratio of indium (In) of the nitride layer is lower than that of the quantum well layer 14W, such as $Al_{s8}In_{t8}Ga_{(1-s8-t8)}N$ ($0 \leq s8 \leq 0.1$, $0 \leq t8 \leq 0.1$), wherein $0 \leq s8 \leq 0.08$, or $0 < s8 < 0.05$ in other embodiments. In one embodiment, the barrier layer 14B can be an $Al_{s8}Ga_{(1-s8)}N$ layer, a GaN layer, or a laminated structure comprising an $Al_{s8}Ga_{(1-s8)}N$ layer and a GaN layer, wherein $0 < s8 \leq 0.05$. The number of periods in which the quantum well layers 14W and the barrier layers 14B are alternately stacked may be 2 to 20, 3 to 15, or 4 to 12. If the number of the periods is too large, the thickness of the active structure 14 can be too thick to deteriorate the epitaxial quality and further reduce the luminous efficiency of the LED. If the number of the periods is too small, the thickness of the active structure 14 is too thin, the recombination of electrons and electron holes cannot be effectively achieved, which reduces the luminous efficiency of the LED. As shown in FIG. 2, the active structure 14 comprises a total thickness between 100 nm and 200 nm, which is greater than the total thickness of the stress relief structure 12 but less than the total thickness of the periodic structure 10.

In the present embodiment, the narrow band gap layer 12A of the stress relief structure 12 comprises $In_{t5}Ga_{(1-t5)}N$ ($0 < t5 \leq 0.1$), and the quantum well layer 14W of the active structure 14 comprises $In_{t7}Ga_{(1-t7)}N$ ($0.1 < t7 < 0.15$). With the narrow band gap layer 12A of the stress release structure 12 comprising less indium (In) composition than that of the quantum well layer 14W of the active structure 14, the epitaxial lattice is smoothly relaxed towards the active structure 14. Accordingly, the narrow band gap layer 12A of the stress release structure 12 can further improve the diffusion of electrons to increase the luminous efficiency.

Figure 6:
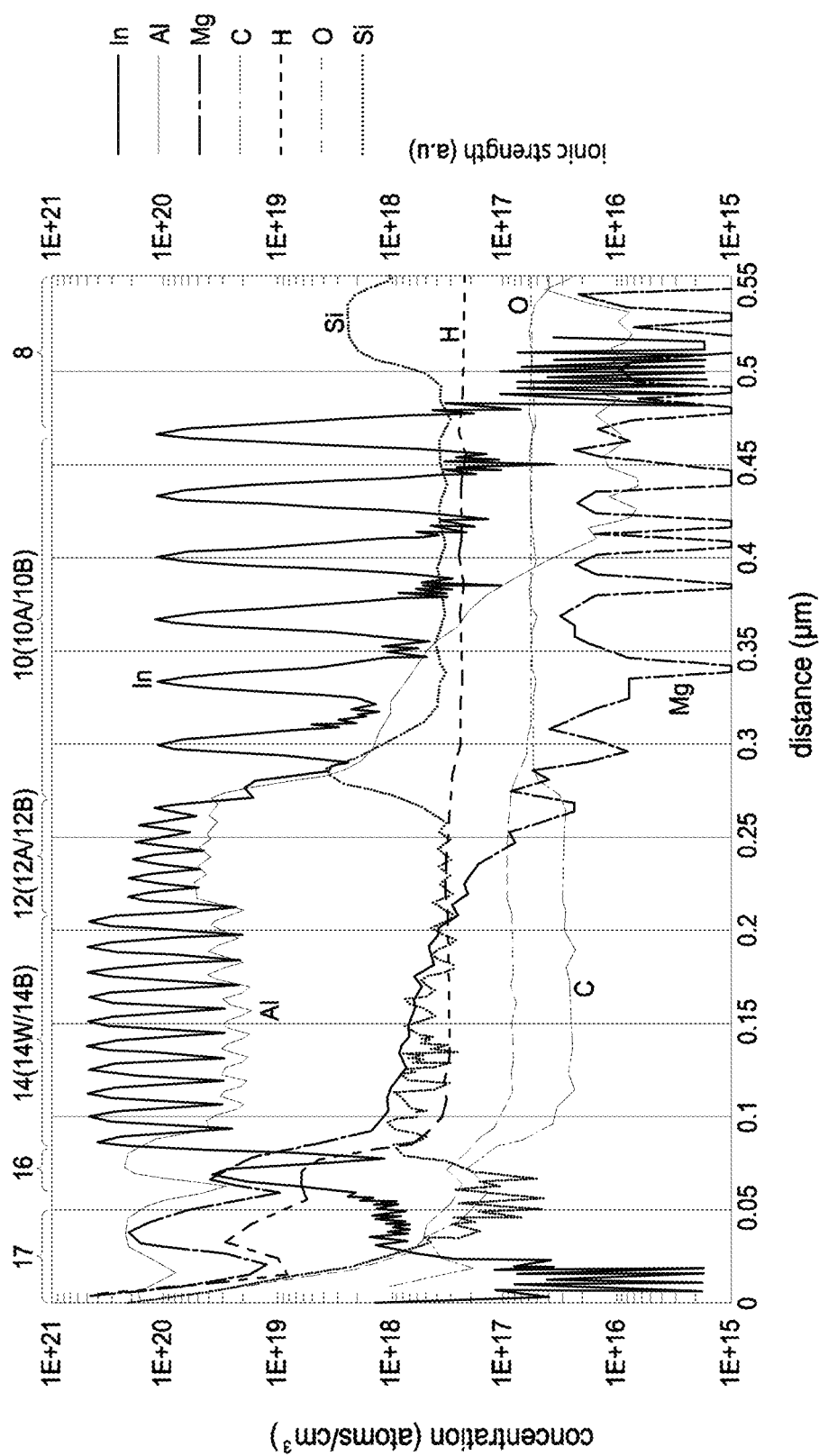
FIG. 6 shows a diagram of the secondary ion mass spectrometer (SIMS) of the light-emitting device 1 in accordance with an embodiment of the present disclosure.

FIG. 6 is a secondary ion mass spectrometer (SIMS) diagram of the light-emitting device 1 in accordance with one embodiment of the present disclosure. The horizontal axis of FIG. 6 corresponds to the distance away from the upper surface of the epitaxial structure of the light-emitting device 1, for example, the distance away from the upper surface of the contact layer 18. The closer to the left side in the diagram, the closer to the upper surface of the epitaxial structure of the light-emitting device 1. The closer to the right side in the diagram, the farther from the upper surface of the epitaxial structure of the light-emitting device 1. "1E+M" on the vertical axis of FIG. 6 represents "$1\times10^{M}$". The left side of the vertical axis represents the concentration of impurities, such as elements of C, H, O, Si and Mg, and the right side of the vertical axis represents the ionic strength, namely, the relative strength or the relative composition of the elements aluminum (Al) and indium (In), not quantitative composition of the elements aluminum (Al) and indium (In). From the relative strengths of the elements aluminum (Al) and indium (In) in the SIMS diagram, the relative average compositions of the elements aluminum (Al) and indium (In) of each layer could be determined. The average composition of each element will be described below. The area which shows the periodical changes of the indium (In) content of the periodic structure 10 corresponds to the first semiconductor layers 10A and the second semiconductor layers 10B. The indium (In) content of the first semiconductor layers 10A is higher than that of the second semiconductor layers 10B. The first semiconductor layers 10A and the second semiconductor layers 10B are alternately stacked to form a periodic structure 10 with six periods. The area which shows the periodical changes of the indium (In) content of the stress relief structure 12 corresponds to the narrow band gap layers 12A and the wide band gap layers 12B. The indium (In) content of the narrow band gap layer 12A is higher than that of the wide band gap layer 12B. The narrow band gap layers 12A and the wide band gap layers 12B are alternately stacked to form the stress relief structure 12 with six periods. The area which shows the periodical changes of the indium (In) content of the active structure 14 corresponds to the quantum well layers 14W and the barrier layers 14B. The indium (In) content of the quantum well layer 14W is higher than the indium (In) content of the barrier layer 14B. The quantum well layers 14W and the barrier layers 14B are alternately stacked to form the active structure 14 with ten periods. The quantum well layers 14W and the barrier layers 14B of the active structure 14, the narrow band gap layers 12A and the wide band gap layers 12B of the stress relief structure 12, and the first semiconductor layers 10A and the second semiconductor layers 10B of the periodic structure 10 may be distinguished by Indium (In) composition change rate measured by secondary ion mass spectrometer. As shown in FIG. 6, the quantum well layers 14W of the active structure 14, the narrow band gap layers 12A of the stress relief structure 12 and the first semiconductor layers 10A of the periodic structure 10 have different indium (In) ion strengths. In other words, the indium (In) ion strength of the quantum well layers 14W of the active structure 14 is relatively greater than the indium (In) ion strength of the narrow band gap layer 12A of the stress relief structure 12, and the indium (In) ion strength of the narrow band gap layer 12A of the stress relief structure 12 is relatively greater than the indium (In) ion strength of the first semiconductor layers 10A of the periodic structure 10. Therefore, the indium (In) average composition of the quantum well layer 14W of the active structure 14 is greater than the indium (In) average composition of the narrow band gap layer 12A of the stress relief structure 12, and the indium (In) average composition of the narrow band gap layer 12A of the stress relief structure 12 is greater than the indium (In) average composition of the first semiconductor layers 10A of the periodic structure 10.

Figure 7:
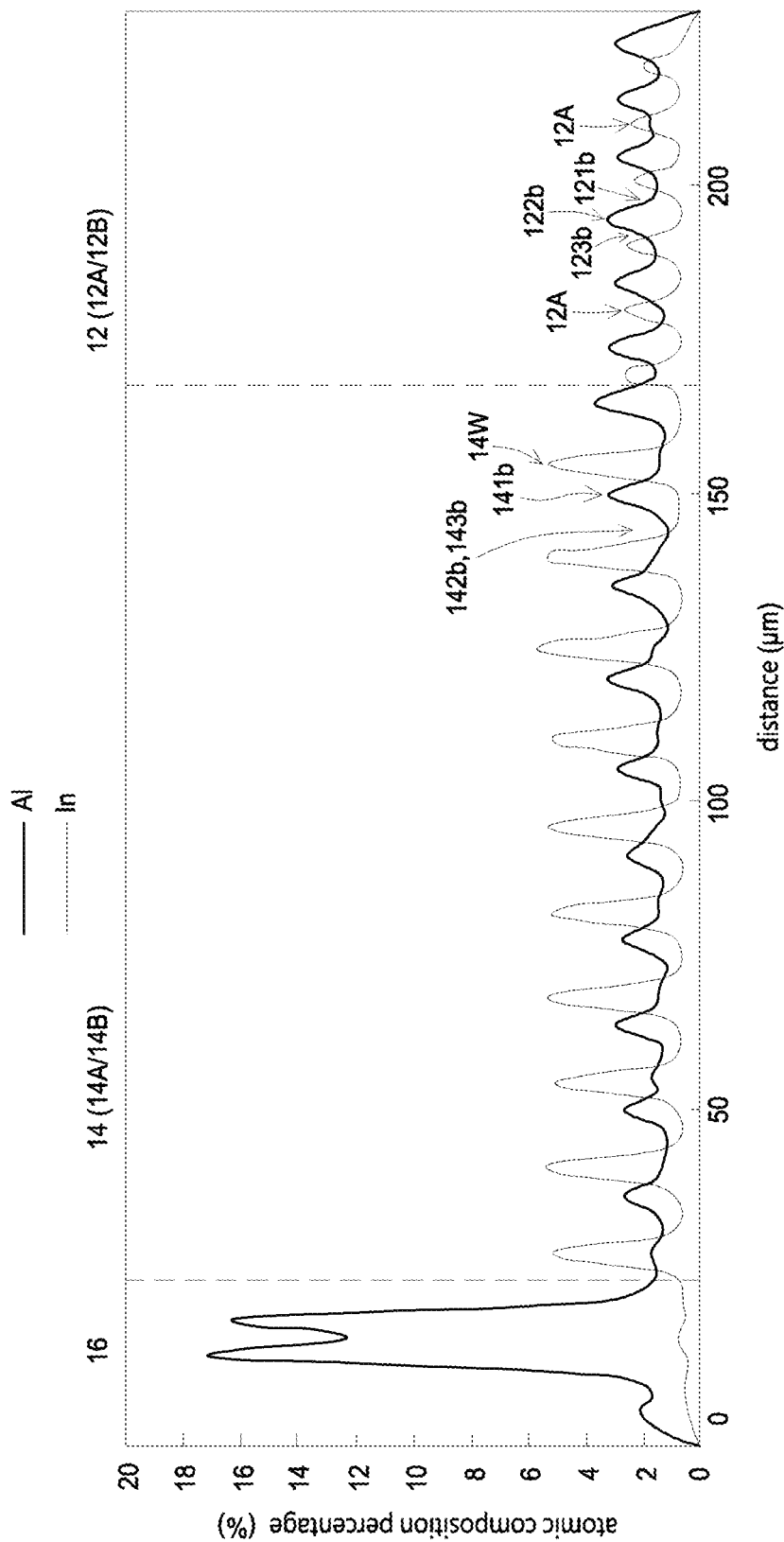
FIG. 7 shows a diagram of the energy dispersive X-ray spectrometer (EDX) of the light-emitting device 1 in accordance with an embodiment of the present disclosure.

FIG. 7 is an energy dispersive X-ray spectrometer (EDX) diagram of the light-emitting device 1 in accordance with one embodiment of the present disclosure. The horizontal axis of FIG. 7 corresponds to the distance away from the upper surface of the epitaxial structure of the light-emitting device 1. The closer to the left side of the diagram, the closer to the upper surface of the epitaxial structure of the light-emitting device 1. The closer to the right side of the diagram, the farther from the upper surface of the epitaxial structure of the light-emitting device 1. The vertical axis of FIG. 7 represents the composition percentages of elements, such as the composition percentages of aluminum (Al) and indium (In). The area which shows the periodical changes of the indium (In) content and the aluminum (Al) content in the stress relief structure 12 corresponds to the narrow band gap layers 12A and the wide band gap layers 12B. The indium (In) content of the narrow band gap layer 12A is higher than that of the wide band gap layer 12B. The aluminum (Al) content of the wide band gap layer 12B is higher than the aluminum (Al) content of the narrow band gap layer 12A. The narrow band gap layers 12A and the wide band gap layers 12B are alternately stacked to form the stress relief structure 12 with 6 periods. The positions where the indium (In) content and the aluminum (Al) content in the active structure 14 periodically change are the positions of the quantum well layers 14W and the barrier layers 14B. The indium (In) content of the quantum well layer 14W is higher than that of the barrier layer 14B. The aluminum (Al) content of the barrier layer 14B is higher than that of the quantum well layer 14W. The quantum well layers 14W and the barrier layers 14B are alternately stacked to form the active structure 14 with ten periods. The quantum well layers 14W and the barrier layers 14B of the active structure 14, and the narrow band gap layers 12A and the wide band gap layers 12B of the stress relief structure 12 may be distinguished with the indium (In) content change rate or the aluminum (Al) content change rate measured by energy dispersive X-ray spectrometer (EDX). As shown in FIG. 7, the indium (In) composition of the quantum well layers 14W of the active structure 14 is greater than that of the narrow band gap layers 12A of the stress relief structure 12.

The quantum well layers 14W comprise a first quantum well layer 14W1 and a second quantum well layer 14W2. The barrier layers 14B comprise a first barrier layer 14B1 and a second barrier layer 14B2. As shown in FIG. 5, in order to identify each of the quantum well layers 14W and each of the barrier layers 14B, these layers are numbered as a first quantum well layer 14W1, a first barrier layer 14B1, a second quantum well layer 14W2, a second barrier layer 14B2, and so forth, in the direction from the n-type nitride semiconductor structure 8 toward the p-type nitride semiconductor structure 17. In one growth direction of the active structure 14, the numbers of the period formed by the first quantum well layer 14W1 and the first barrier layer 14B1 and the period formed by the second quantum well layer 14W2 and the second barrier layer 14B2 are respectively exemplified as one, but not limited to the number shown in the diagram. For example, the period formed by the first quantum well layers 14W1 and the first barrier layers 14B1 may be two or more, and the first quantum well layers 14W1 and the first barrier layers 14B1 may be alternately stacked to form a first group of the active structures 14. The period formed by the second quantum well layers 14W2 and the second barrier layers 14B2 may be two or more, and the second quantum well layers 14W2 and the second barrier layers 14B2 may be alternately stacked to form a second group of the active structures 14.

In the present embodiment, the first quantum well layer 14W1 and the second quantum well layer 14W2 may comprise substantially identical thicknesses and/or substantially identical indium (In) compositions. When each of the quantum well layers 14W comprises an identical thickness and/or an identical indium (In) composition, it is beneficial to reduce the full width at half maximum (FWHM) of the LED, which is preferred for light-emitting devices used in specific applications such as lighting. In another embodiment, when the quantum well layers 14W comprise different thicknesses and/or different indium (In) compositions, it is beneficial to increase the full width at half maximum (FWHM) of the LED, which is suitable for light-emitting devices used in specific applications such as a display.

If the thickness of the quantum well layer 14W is too thin, the effective recombination of electrons and electron holes in the quantum well layer 14W can be affected, which reduces the luminous efficiency of the LED. If the thickness of the quantum well layer 14W is too thick, such large thickness may cause the stress of the quantum well layer 14W which reduces the epitaxial quality and therefore affects the recombination efficiency of electrons and electron holes, and further affecting the luminous efficiency of the LED. In one embodiment, the thicknesses of each of the quantum well layers 14W are identical to facilitate actual growth control. As shown in FIGS. 2 and 5, the first barrier layer 14B1 and the second barrier layer 14B2 may comprise substantially identical thicknesses. In another embodiment, the thickness of the first barrier layer 14B1 may be greater than the thickness of the second barrier layer 14B2 to increase the recombination efficiency of electrons and electron holes. The difference between the thickness of the first barrier layer 14B1 and the thickness of the second barrier layer 14B2 is maintained within 10% of the thickness of the second barrier layer 14B2.

The thicknesses of the barrier layers 14B gradually decrease along the growth direction of the active structure 14. Compared with the first barrier layer 14B1 far from the p-type nitride semiconductor structure 17, the thickness of the second barrier layer 14B2 close to the p-type nitride semiconductor structure 17 is smaller so that electron holes are more easily injected into the quantum well layer 14W, which increases the transmission efficiency of electron holes in the quantum well layers 14W, improves the distribution uniformity of electron holes in the quantum well layer 14W, increases the radiation recombination efficiency of electrons and electron holes and further increases the luminous efficiency of the LED. In the present embodiment, the thickness of the barrier layer 14B is about 6 nm-15 nm, and the difference between the thicknesses of the barrier layers 14B is not greater than 2 nm. If the thickness of the barrier layers 14B is too thin, the epitaxial quality may be degraded due to the too thin thickness of the barrier layers 14B. If the thickness of the barrier layers 14B is too thick, it is easy to affect the migration of electrons and electron holes and to block the recombination of electrons and electron holes, which reduces the luminous efficiency of the LED.

At least one of the barrier layers 14B comprises barrier sub-layers. In the present embodiment, each of the barrier layers 14B comprises barrier sub-layers, such as a first barrier sub-layer 141b, a second barrier sub-layer 142b and a third barrier sub-layer 143b. At least one or each of the barrier sub-layers in the barrier layer 14B comprises a thickness greater than that of the quantum well layer 14W. Each of the barrier sub-layers in the barrier layer 14B comprises a band gap greater than that of the quantum well layer 14W, and at least one barrier sub-layer in the barrier sub-layers of the barrier layer 14B comprises a band gap greater than that of the other barrier sub-layers. For example, the first barrier sub-layer 141b comprises $Al_{s8}Ga_{(1-s8)}N$ (0<s8≤0.05), and the second barrier sub-layer 142b and the third barrier sub-layer 143b comprise GaN.

In one embodiment of the present disclosure, a portion of the barrier layers 14B further comprises a capping layer 144 located between the quantum well layer 14W and the first barrier sub-layer 141b, wherein the capping layer 144 directly contacts the quantum well layer 14W, and the first barrier sub-layer 141b is located between the capping layer 144 and the second barrier sub-layer 142b. The capping layer 144 can prevent the indium (In) in the quantum well layer 14W from escaping due to the subsequent epitaxial temperature or gas condition difference, so the surface morphology deterioration and short wavelength shift of the quantum well layer 14W can be prevented. The band gap of the first barrier sub-layer 141b is greater than the band gap of the second barrier sub-layer 142b, the band gap of the third barrier sub-layer 143b and the band gap of the capping layer 144, respectively. The second barrier sub-layer 142b, the third barrier sub-layer 143b, and the capping layer 144 may comprise GaN. The first barrier sub-layer 141b comprises $Al_{s8}Ga_{(1-s8)}N$ (0<s8<1), wherein s8≤0.08, s8≤0.05, or s8≤0.03.

In another embodiment, the barrier layers 14B further comprises an intermediate sub-layer (not shown) located between the capping layer 144 and the first barrier sub-layer 141b. The intermediate sub-layer comprises a lattice constant less than that of the other sub-layers of the barrier layer 14B, and may be formed of a ternary compound semiconductor or binary compound semiconductor having Al and N, such as AlGaN or AlN. In one embodiment, an intermediate sub-layer is formed after each of the quantum well layers 14W, and the compressive stress of the quantum well layers 14W is compensated by adjusting the thickness of the intermediate sub-layer. The intermediate sub-layer comprises a thickness less than that of the other sub-layers of the barrier layer 14B, such as 1 Å to 30 Å.

FIG. 2 is a transmission electron microscope (TEM) image of a portion of the light-emitting device 1 in accordance with an embodiment of the present disclosure. When the composition of the adjacent layers is different, the interface of the adjacent layers may be distinguished under a transmission electron microscope so the thickness of each layer can be measured. In one embodiment of the present disclosure, the film thickness of each layer and each sub-layer of the stress relief structure 12 and the film thickness of each layer and each sub-layer of the active structure 14 may be measured by a transmission electron microscope (TEM). The aluminum (Al) composition of each sub-layer is detected by energy dispersive X-ray spectrometer (EDX), and the relative relationship of average aluminum (Al) composition of each layer is detected by secondary ion mass spectrometer (SIMS).

The definition of the average aluminum (Al) composition is described below by taking the wide band gap layer 12B of the stress relief structure 12 as an example. As shown in FIG. 4, the wide band gap layer 12B comprises a first wide band gap sub-layer 121b, a second wide band gap sub-layer 122b, and a third wide band gap sub-layer 123b. In one embodiment, the first wide band gap sub-layer 121b and the third wide band gap sub-layer 123b comprise GaN. The second wide band gap sub-layer 122b comprises $Al_{s6}Ga_{(1-s6)}N$. In order to simplify the description, firstly, the thicknesses of the first wide band gap sub-layer 121b, the second wide band gap sub-layer 122b, and the third wide band gap sub-layer 123b of the stress relief structure 12 are measured by a transmission electron microscope (TEM) and are defined as $T_a$, $T_b$ and $T_c$, respectively. Since the composition of the second wide band gap sub-layer 122b comprises aluminum and the compositions of the first wide band gap sub-layer 121b and the third wide band gap sub-layer 123b do not comprise aluminum, the aluminum (Al) composition of the wide band gap sub-layer 12B detected by EDX is defined as s6, namely, the aluminum composition of the second wide band gap sub-layer 122b is s6. Based on the ratio between the thickness $T_b$ of the second wide band gap sub-layer 122b and the total thickness of the wide band gap layer 12B (namely, the sum of thicknesses $T_a$, $T_b$ and $T_a$), the average aluminum (Al) composition A of the wide band gap layer 12B is the product of the aluminum (Al) composition of the wide band gap layer 12B and the film thickness ratio of $Al_{s6}Ga_{(1-s6)}N$ and can be determined by the following equation:

$$A = \frac{Tb}{Ta + Tb + Tc} \times s6$$

The definition of the average aluminum (Al) composition is described below by taking the wide band gap layer 12B of the stress relief structure 12 as an example (not shown). As shown in FIG. 4, the wide band gap layer 12B comprises a first wide band gap sub-layer 121b, a second wide band gap sub-layer 122b and a third wide band gap sub-layer 123b. The first wide band gap sub-layer 121b comprises $Al_{x6}Ga_{(1-x6)}N$, the second wide band gap sub-layer 122b comprises $Al_{s6}Ga_{(1-s6)}N$, and the third wide band gap sub-layer 123b comprises $Al_{y6}Ga_{(1-y6)}N$. Firstly, in order to simplify the description, the thicknesses of the first wide band gap sub-layer 121b, the second wide band gap sub-layer 122b, and the third wide band gap sub-layer 123b of the stress relief structure 12 are measured by a transmission electron microscope (TEM) and are defined as thicknesses $T_A$, $T_B$, and $T_C$, respectively. The aluminum (Al) compositions of the first wide band gap sub-layer 121b, the second wide band gap sub-layer 122b, and the third wide band gap sub-layer 123b detected by energy dispersive X-ray spectrometer are x6, s6 and y6. The average aluminum (Al) composition P of the wide band gap layer 12B is obtained by the following equation by combining the analysis results of the energy dispersive X-ray spectrometer diagram and the film thickness of each sub-layer measured by a transmission electron microscope. Based on the respective thicknesses $T_A$ and $T_B$ of each of the wide band gap sub-layers 121b to 123b and the ratio between the thickness $T_C$ and the total thickness of the wide band gap layer 12B (namely, the sum of thicknesses $T_a$, $T_b$, and $T_c$), the average aluminum (Al) composition P of the wide band gap layer 12B satisfies the following equation:

$$P = \frac{TA}{TA + TB + TC} \times x6 + \frac{TB}{TA + TB + TC} \times s6 + \frac{TC}{TA + TB + TC} \times y6$$

As shown in FIG. 6, with the detection results of the secondary ion mass spectrometer (SIMS), it can be qualitatively determined that the average aluminum composition comprised in the wide band gap layer 12B is greater than that comprised in the barrier layer 14B. The average aluminum composition comprised in the wide band gap layer 12B and the barrier layer 14B can be quantitatively obtained by the above equation. As shown in FIG. 7, in the energy dispersive X-ray spectrometer diagram, it can be detected that the Al composition of the second wide band gap sub-layer 122b comprising $Al_{s6}Ga_{(1-s6)}N$ in the wide band gap layer 12B is greater than or equal to that of the first barrier sub-layer 141b comprising $Al_{s8}Ga_{(1-s8)}N$ in the barrier layer 14B.

In the present embodiment, the wide band gap layer 12B comprises a first wide band gap sub-layer 121b, a second wide band gap sub-layer 122b and a third wide band gap sub-layer 123b, wherein the second wide band gap sub-layer 122b comprising $Al_{s6}Ga_{(1-s6)}N$ is located between the first wide band gap sub-layer 121b and the third wide band gap sub-layer 123b which comprise GaN. As shown in FIG. 7, the second wide band gap sub-layer 122b comprising $Al_{s6}Ga_{(1-s6)}N$ is located approximately in the center between two adjacent narrow band gap layers 12A.

In the present embodiment, as shown in FIG. 7, the barrier layer 14B comprises a first barrier sub-layer 141b, a second barrier sub-layer 142b and a third barrier sub-layer 143b, wherein the first barrier sub-layer 141b comprising AlGaN is closer to the quantum well layer 14W comprising InGaN than the second barrier sub-layer 142b and the third barrier sub-layer 143b which comprise GaN.

In one embodiment of the present disclosure, as shown in FIG. 4 and FIG. 5, the wide band gap layer 12B of the stress relief structure 12 comprises $Al_{s6}Ga_{(1-s6)}N$ (0<s6≤0.05), and the barrier layer 14B of the active structure 14 comprises $Al_{s8}Ga_{(1-s8)}N$ (0<s8≤0.05). The wide band gap layer 12B comprises a first wide band gap sub-layer 121b, a second wide band gap sub-layer 122b, and a third wide band gap sub-layer 123b. There is a first film thickness ratio of the film thickness of the second wide band gap sub-layer 122b comprising $Al_{s6}Ga_{(1-s6)}N$ to the film thickness of the wide band gap layer 12B. The barrier layer 14B comprises a first barrier sub-layer 141b, a second barrier sub-layer 142b and a third barrier sub-layer 143b. There is a second film thickness ratio of the film thickness of the first barrier sub-layer 141b comprising $Al_{s8}Ga_{(1-s8)}N$ to the film thickness of the barrier layer 14B. As shown in FIG. 7, when the aluminum (Al) composition of the second wide band gap sub-layer 122b comprising $Al_{s6}Ga_{(1-s6)}N$ in the wide band gap layer 12B is equal to the aluminum (Al) composition of the first barrier sub-layer 141b comprising $Al_{s8}Ga_{(1-s8)}N$ in the barrier layer 14B, namely, the aluminum (Al) composition s6 of the second wide band gap sub-layer 122b is the same as the aluminum (Al) composition s8 of the first barrier sub-layer 141b, the first film thickness ratio can be greater than the second film thickness ratio, so that the average aluminum (Al) composition of the wide band gap layer 12B is greater than the average aluminum (Al) composition of the barrier layer 14B, which can be determined by FIG. 6. In the energy dispersive X-ray spectrometer diagram, when the aluminum (Al) composition of the second wide band gap sub-layer 122b of the wide band gap layer 12B is greater than the aluminum (Al) composition of the first barrier sub-layer 141b of the barrier layer 14B, the first film thickness ratio may also be greater than or equal to the second film thickness ratio, so that the average aluminum (Al) composition of the wide band gap layer 12B is greater than the average aluminum (Al) composition of the barrier layer 14B, which may also be determined by the secondary ion mass spectrometer diagram.

In one embodiment of the present disclosure, as shown in FIG. 1 and FIG. 5, the first barrier layer 14B1 is closer to the stress relief structure 12 than the second barrier layer 14B2. The first barrier layer 14B1 comprises a first barrier sub-layer 141b1, a second barrier sub-layer 142b1, and a third barrier sub-layer 143b1. The second barrier layer 14B2 comprises a first barrier sub-layer 141b2, a second barrier sub-layer 142b2, and a third barrier sub-layer 143b2. When the thickness of the first barrier layer 14B1 is greater than the thickness of the second barrier layer 14B2, the thickness of any one or more barrier sub-layers of the first barrier layer 14B1 may be greater than that of any one or more barrier sub-layers of the second barrier layer 14B2. In one embodiment, the thickness of the first barrier sub-layer 141b1 of the first barrier layer 14B1 is greater than the thickness of the first barrier sub-layer 141b2 of the second barrier layer 14B2, the thickness of the second barrier sub-layer 142b1 of the first barrier layer 14B1 is approximately identical to the thickness of the second barrier sub-layer 142b2 of the second barrier layer 14B2, and the thickness of the third barrier sub-layer 143b1 of the first barrier layer 14B1 is approximately identical to the thickness of the third barrier sub-layer 143b2 of the second barrier layer 14B2. In one embodiment, the composition and aluminum (Al) composition of the first barrier sub-layer 141*b*1 of the first barrier layer 14B1 may be the same as the composition and aluminum (Al) composition of the first barrier sub-layer 141*b*2 of the second barrier layer 14B2. The composition of the second barrier sub-layer 142*b*1 of the first barrier layer 14B1 is the same as that of the second barrier sub-layer 142*b*2 of the second barrier layer 14B2, and the composition of the third barrier sub-layer 143*b*1 of the first barrier layer 14B1 is the same as the composition of the third barrier sub-layer 143*b*2 of the second barrier layer 14B2. As shown in FIG. 6 and FIG. 7, the average aluminum (Al) composition of the first barrier layer 14B1 close to the stress relief structure 12 may be greater than the average aluminum (Al) composition of the second barrier layer 14B2 far from the stress relief structure 12.

In an embodiment of the present disclosure, as shown in FIG. 4, the first wide band gap layer 12B1 comprises a first wide band gap sub-layer 121*b*1, a second wide band gap sub-layer 122*b*1, and a third wide band gap sub-layer 123*b*1. The second wide band gap layer 12B2 comprises a first wide band gap sub-layer 121*b*2, a second wide band gap sub-layer 122*b*2, and a third wide band gap sub-layer 123*b*2. When the thickness of the second wide band gap layer 12B2 is greater than that of the first wide band gap layer 12B1, the thickness of any one or more sub-layers of the second wide band gap layer 12B2 may be greater than the thickness of any one or more sub-layers of the first wide band gap layer 12B1. In one embodiment, the thickness of the second wide band gap sub-layer 122*b*2 of the second wide band gap layer 12B2 is greater than the thickness of the second wide band gap sub-layer 122*b*1 of the first wide band gap layer 12B1, but the thickness of the first wide band gap sub-layer 121*b*1 of the first wide band gap layer 12B1 is substantially the same as the thickness of the first wide band gap sub-layer 121*b*2 of the second wide band gap layer 12B2, and/or the thickness of the third wide band gap sub-layer 123*b*1 of the first wide band gap layer 12B1 is substantially the same as the thickness of the third wide band gap sub-layer 123*b*2 of the second wide band gap layer 12B2. In one embodiment, as shown in FIG. 7, the aluminum (Al) composition of the second wide band gap sub-layer 122*b*2 comprising AlGaN in the second wide band gap layer 12B2 may be greater than or equal to the aluminum (Al) composition of the second wide band gap sub-layer 122*b*1 comprising AlGaN in the first wide band gap layer 12B1. The composition of the first wide band gap sub-layer 121*b*1 of the first wide band gap layer 12B1 is the same as that of the first wide band gap sub-layer 121*b*2 of the second wide band gap layer 12B2, and the composition of the third wide band gap sub-layer 123*b*1 of the first wide band gap layer 12B1 is the same as that of the third wide band gap sub-layer 123*b*2 of the second wide band gap layer 12B2. Furthermore, as shown in FIG. 6, the average aluminum (Al) composition of the second wide band gap layer 12B2 is greater than the average aluminum (Al) composition of the first wide band gap layer 12B1.

As shown in FIG. 5, the first barrier sub-layer 141*b*, the second barrier sub-layer 142*b*, and the third barrier sub-layer 143*b* respectively have a thickness greater than 1 nm but less than 5 nm. The capping layer 144 has a thickness not greater than 1 nm. Compared with the thicknesses of the first barrier sub-layer 141*b*, a second barrier sub-layer 142*b* and a third barrier sub-layer 143*b*, the thickness of the capping layer 144 is relatively thin. A second thickness ratio of a thickness of the first barrier sub-layer 141*b* and a thickness of the barrier layer 14B is between 35% and 45%. In the present embodiment, the second thickness ratio of the first barrier sub-layer 141*b* to the barrier layer 14B in the active structure 14 may be less than or substantially the same as the first thickness ratio of the second wide band gap sub-layer 122*b* to the wide band gap layer 12B in the stress relief structure 12. The sum of a thickness of the first barrier sub-layer 141*b* and a thickness of the capping layer 144 is less than the sum of a thickness of the second barrier sub-layer 142*b* and a thickness of the third barrier sub-layer 143*b*.

In the present embodiment, the first barrier sub-layer 141*b* is closer to the n-type nitride semiconductor structure 8 than the second barrier sub-layer 142*b*, the second barrier sub-layer 142*b* is closer to the n-type nitride semiconductor structure 8 than the third barrier sub-layer 143*b*, and the third barrier sub-layer 143*b* is closer to the n-type nitride semiconductor structure 8 than the capping layer 144. The third barrier sub-layer 143*b* and the capping layer 144 respectively contact two opposite sides of the quantum well layer 14W. The capping layer 144 can relieve stress and defects caused by lattice mismatch between the first barrier sub-layer 141*b* and the quantum well layer 14W.

Since the mobility of electrons is higher than that of electron holes, electrons and electron holes generally recombine in the quantum well layer 14W close to the p-type nitride semiconductor structure 17. By doping an n-type impurity into the barrier layer 14B, the injection efficiency of electrons can be improved so the forward voltage of the light-emitting device 1 can be reduced. One of the first barrier sub-layer 141*b*, the second barrier sub-layer 142*b* and the third barrier sub-layer 143*b* may comprise an n-type impurity of relatively high concentration. The remaining first barrier sub-layer 141*b*, the second barrier sub-layer 142*b* and the third barrier sub-layer 143*b* may be doped with an n-type impurity of a relatively low concentration or not be doped with an n-type impurity. In one embodiment, the third barrier sub-layer 143*b* comprises an n-type impurity. In one embodiment of the present disclosure, at least one of the first barrier sub-layer 141*b*, the second barrier sub-layer 142*b*, the third barrier sub-layer 143*b* and the capping layer 144 comprises an n-type impurity, and the n-type impurity comprises silicon (Si), carbon (C), or germanium (Ge). The concentration of the n-type impurity can be less than $1 \times 10^{18}$ $cm^{-3}$ but greater than or equal to $1 \times 10^{17}$ $cm^{-3}$. When the concentration of the n-type impurity is less than $1 \times 10^{17}$ $cm^{-3}$, due to the reduced number of carriers, a polarization phenomenon is caused, which increases the operating voltage and reduces the luminous efficiency. When the concentration of the n-type impurity is greater than $1 \times 10^{18}$ $cm^{-3}$, the epitaxial quality is also affected and the luminous efficiency is reduced due to the too high concentration of the impurity.

In one embodiment of the present disclosure, the second barrier layer 14B2 close to the p-type nitride semiconductor structure 17 has a thickness thinner than that of the first barrier layer 14B1 far from the p-type nitride semiconductor structure 17. The mobility of electrons is increased by doping silicon (Si) in the barrier layer 14B of the active structure 14, and the doping concentration of silicon (Si) is increased from a side close to the n-type nitride semiconductor structure 8 to another side away from the n-type nitride semiconductor structure 8. In other words, the silicon (Si) doping concentration of the second barrier layer 14B2 close to the p-type nitride semiconductor structure 17 is higher than the silicon (Si) doping concentration of the first barrier layer 14B1 far from the p-type nitride semiconductor structure 17 so that the distribution of electrons in the barrier layer 14B is uniform. In that case, the mobility of electrons and electron holes in the active structure 14 is increased so more electron holes and electrons can be radiatively recombined to emit light in the active structure 14 to improve the luminous efficiency of the LED. The doping concentration of silicon (Si) can be $5\times10^{17}$ to $10^{18}$ cm$^{-3}$. Doping an appropriate amount of silicon (Si) into the barrier layers 14B can also reduce the defects of the active structure 14 and improve the epitaxial quality of the active structure 14, further improving the luminous efficiency of the LED.

In the present embodiment, the n-type impurity concentration of the wide band gap layer 12B of the stress relief structure 12 is about 45%-60% of the n-type impurity concentration of the barrier layer 14B of the active structure 14. By increasing the n-type impurity concentration of the active structure 14, the electron concentration of the active structure 14 is increased, which improves the recombination efficiency of electrons and electron holes in the active structure 14 and the luminous efficiency of the LED.

The active layer 14 may adjoin the stress relief structure 12 directly or indirectly. In one embodiment of the active structure 14 in direct contact with the stress relief structure 12, the active structure 14 may be in contact with the narrow band gap layer 12A of the stress relief structure 12 through the first barrier sub-layer 141b, the second barrier sub-layer 142b or the third barrier sub-layer 143b of the barrier layer 14B. For instance, the first barrier sub-layer 141b comprising $Al_{s8}Ga_{(1-s8)}N$ (0<s8<1) may be in contact with the narrow band gap layer 12A of the stress relief structure 12. In another embodiment, the active structure 14 may be in contact with the wide band gap layer 12B of the stress relief structure 12 through the quantum well layer 14W.

In the present embodiment, a final barrier layer 14LB is disposed on the active structure 14 and is located between the electron blocking structure 16 and the active structure 14. The final barrier layer 14LB comprises an n-type impurity, which can be silicon (Si), carbon (C), or germanium (Ge). The concentration of the n-type impurity can be less than $5\times10^{17}$ cm$^{-3}$, such as less than or equal to $1\times10^{17}$ cm$^{-3}$. The final barrier layer 14LB may comprise indium (In) to block electrons. The final barrier layer 14LB may comprise $Al_{s9}In_{t9}Ga_{(1-s9-t9)}N$ (0≤s9≤1, 0≤t9≤1), or $In_{t9}Ga_{(1-t9)}N$ (0<t9<1 or 0.002<t9<0.02). In one embodiment, the indium (In) content of the quantum well layer 14W is greater than the indium (In) content of the narrow band gap layer 12A, and the indium (In) content of the narrow band gap layer 12A may be greater than that of the final barrier layer 14LB.

As shown in FIG. 1 and FIG. 6, due to the influence of thermal diffusion during the growth of the p-type nitride semiconductor structure 17, the stress relief structure 12, the active structure 14 and/or the final barrier layer 14LB comprise a p-type impurity, such as magnesium (Mg), having a concentration of greater than $1\times10^{17}$ cm$^{-3}$, which can be observed by the secondary ion mass spectrometer.

As shown in FIG. 1, the electron blocking structure 16 is disposed between the active structure 14 and the p-type nitride semiconductor structure 17. The electron blocking structure 16 blocks electrons from overflowing from the active structure 14 to the p-type nitride semiconductor structure 17 and allows electron holes being injected into the active structure 14 so the luminous efficiency of the light-emitting device 1 is improved. The material of the electron blocking structure 16 has a band gap greater than that of the p-type nitride semiconductor structure 17 and the band gap of the electron blocking structure 16 is decreased along a direction toward the p-type nitride semiconductor structure 17. The material of the electron blocking structure 16 may or may not comprise a p-type impurity of aluminum indium gallium nitride (AlInGaN), aluminum gallium nitride (AlGaN), and/or aluminum nitride (AlN), such as $Al_{s10}In_{t10}Ga_{(1-s10-t10)}N$ (0≤s10≤1, 0<t10≤0.05), or $Al_{s10}Ga_{(1-s10)}N$ (0<s10<1 or 0.05<s10≤0.5). The thickness of the electron blocking structure 16 may be 10 nm to 100 nm, 20 nm to 80 nm, or 30 nm to 60 nm. The electron blocking structure 16 may be a single layer or comprise multiple layers. As shown in FIG. 6, the average aluminum (Al) composition of the electron blocking structure 16 is greater than the average aluminum (Al) composition of the active structure 14, and is greater than the average aluminum (Al) composition of the stress relief structure 12. As shown in FIG. 7, the aluminum (Al) composition of the electron blocking structure 16 is greater than the aluminum (Al) composition of any one of the layers of the active structure 14, and is greater than the aluminum (Al) composition of any one of the layers of the stress relief structure 12.

In one embodiment, the electron blocking structure 16 may be doped with a p-type impurity, such as magnesium (Mg), and the p-type doping concentration of the electron blocking structure 16 is decreased along a direction toward the active structure 14. The doping concentration of the p-type impurity in the electron blocking structure 16 may be lower than the doping concentration of the p-type impurity in the p-type nitride semiconductor structure 17. As shown in FIG. 6, the concentration of the p-type impurity in the electron blocking structure 16 can be greater than or equal to $1\times10^{19}$ cm$^{-3}$, or greater than or equal to $1\times10^{20}$ cm$^{-3}$.

The p-type nitride semiconductor structure 17 may comprise a multilayer structure composed of a p-type AlGaN layer and/or a p-type GaN layer, or a single-layer structure composed of a p-type AlGaN layer or a p-type GaN layer. The p-type nitride semiconductor structure 17 comprises $Al_{s11}In_{t11}Ga_{(1-s11-t11)}N$ (0≤s11≤1, 0<t11≤1) or $Al_{s11}Ga_{(1-s11)}N$ (0<s11<0.2 or 0.01<s11<0.05). The aluminum (Al) composition in the p-type nitride semiconductor structure 17 is less than the aluminum (Al) composition in the electron blocking structure 16. If the aluminum (Al) molar fraction in the p-type nitride semiconductor structure 17 is greater than 20%, the driving voltage of the light-emitting device 1 is increased. The p-type impurity can be magnesium (Mg), but is not particularly limited to magnesium (Mg). As shown in FIG. 6, the concentration of the p-type impurity in the p-type nitride semiconductor structure 17 can be greater than or equal to $1\times10^{19}$ cm$^{-3}$, or greater than or equal to $1\times10^{20}$ cm$^{-3}$.

The thickness of the p-type nitride semiconductor structure 17 can be greater than or equal to 50 nm and less than or equal to 300 nm. By reducing the thickness of the p-type nitride semiconductor structure 17, the heating time during growth can be reduced and the diffusion of the p-type impurity into the active structure 14 can be suppressed.

The contact layer 18 is formed on the p-type nitride semiconductor structure 17 to form an ohmic contact with a transparent conductive layer 23 described below. The contact layer 18 comprises an n-type impurity or a p-type impurity, and the n-type impurity can be silicon (Si), carbon (C) or germanium (Ge). The p-type impurity can be magnesium (Mg). The concentration of the n-type impurity or the p-type impurity can be greater than $5\times10^{19}$ cm$^{-3}$, or greater than or equal to $1\times10^{20}$ cm$^{-3}$ alternatively. The contact layer 18 comprises a thickness less than or equal to 10 nm and greater than 0.1 nm. The contact layer 18 is a single-layer structure comprising $Al_{s12}In_{t12}Ga_{(1-s12-t12)}N$ (0≤s12≤1, 0≤t12≤1) or $Al_{s12}Ga_{(1-s12)}N$ (0<s12<1 or 0.03≤s12≤0.3).

The transparent conductive layer 23 comprises a transparent oxide as an ohmic contact layer. In order to reduce the contact resistance and improve the efficiency of current spreading, the material of the transparent oxide comprises a material which is transparent to the light emitted by the active layer. The transparent conductive layer 23 comprises a light-transmitting conductive oxide, such as indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), or fluorine tin oxide (FTO), and comprises one of metal layers, such as aluminum (Al), nickel (Ni) or gold (Au), having a thickness less than 500 angstroms. The light-transmitting conductive oxide may further comprise various dopants.

The insulating layer 27 may be a single-layer structure, which is composed of silicon oxide, silicon nitride or silicon oxynitride. The insulating layer 27 may also comprise two or more materials with different refractive indices stacked alternately to form a distributed Bragg reflector (DBR) structure, which selectively reflects the light of a specific wavelength. For example, an insulating reflective structure with high reflectivity may be formed by stacking layers such as $SiO_2/TiO_2$ or $SiO_2/Nb_2O_5$. When $SiO_2/TiO_2$ or $SiO_2/Nb_2O_5$ forms a distributed Bragg reflector (DBR) structure, each layer of the distributed Bragg reflector (DBR) structure is designed to be one or an integer multiple of the optical thickness of one quarter of the wavelength of the light emitted by the active structure 14. The optical thickness of each layer of the distributed Bragg reflector (DBR) structure may have a deviation of ±30% on the basis of one or an integer multiple of $\lambda/4$. Since the optical thickness of each layer of the distributed Bragg reflector (DBR) structure affects the reflectivity, E-beam evaporation is a suitable process to stably control the thickness of each layer of the distributed Bragg reflector (DBR) structure.

The n-type electrode 21 and the p-type electrode 25 comprise a metal material such as chromium (Cr), titanium (Ti), tungsten (W), gold (Au), aluminum (Al), indium (In), tin (Sn), nickel (Ni), platinum (Pt), silver (Ag), or an alloy of the previously-mentioned materials. The n-type electrode 21 and the p-type electrode 25 may be composed of a single layer or multiple layers. For example, the n-type electrode 21 and the p-type electrode 25 may comprise Ti/Au layer, Ti/Pt/Au layer, Cr/Au layer, Cr/Pt/Au layer, Ni/Au layer, Ni/Pt/Au layer, Cr/Al/Cr/Ni/Au layer or Ag/NiTi/TiW/Pt layer. The n-type electrode 21 and the p-type electrode 25 may be used as a current path for external power to supply electricity to the n-type nitride semiconductor structure 8 and the p-type nitride semiconductor structure 17. The n-type electrode 21 and the p-type electrode 25 comprise a thickness between 1 and 100 µm, between 1.2 and 60 µm, or between 1.5 and 6 µm.

Figure 8:
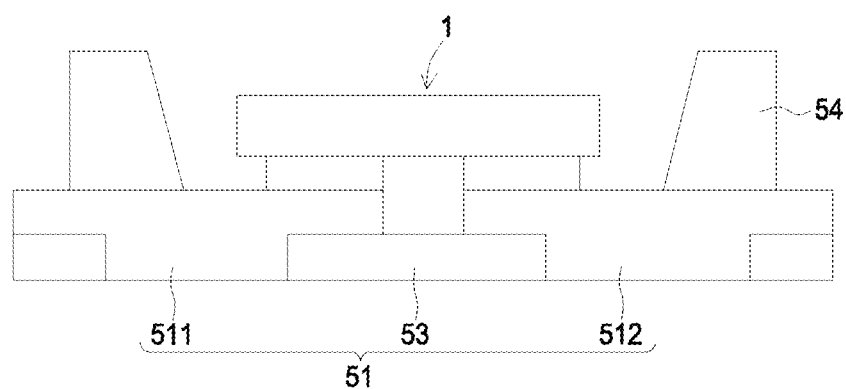
FIG. 8 shows a schematic view of a light emitting apparatus 2 in accordance with an embodiment of the present disclosure.

FIG. 8 is a schematic view of a light emitting apparatus 2 in accordance with one embodiment of the present disclosure. The light-emitting device 1 in the above-mentioned embodiment is mounted on a first pad 511 and a second pad 512 of a package substrate 51 in the form of flip-chip. The first pad 511 and the second pad 512 are electrically insulated by an insulating portion 53 comprising an insulating material. In flip-chip mounting, a side of the growth substrate facing the electrode pad formation surface is set to be the main light extraction surface. In order to increase the light extraction efficiency of the light emitting apparatus 2, a reflection structure 54 may be disposed around the light-emitting device 1.

Figure 9:
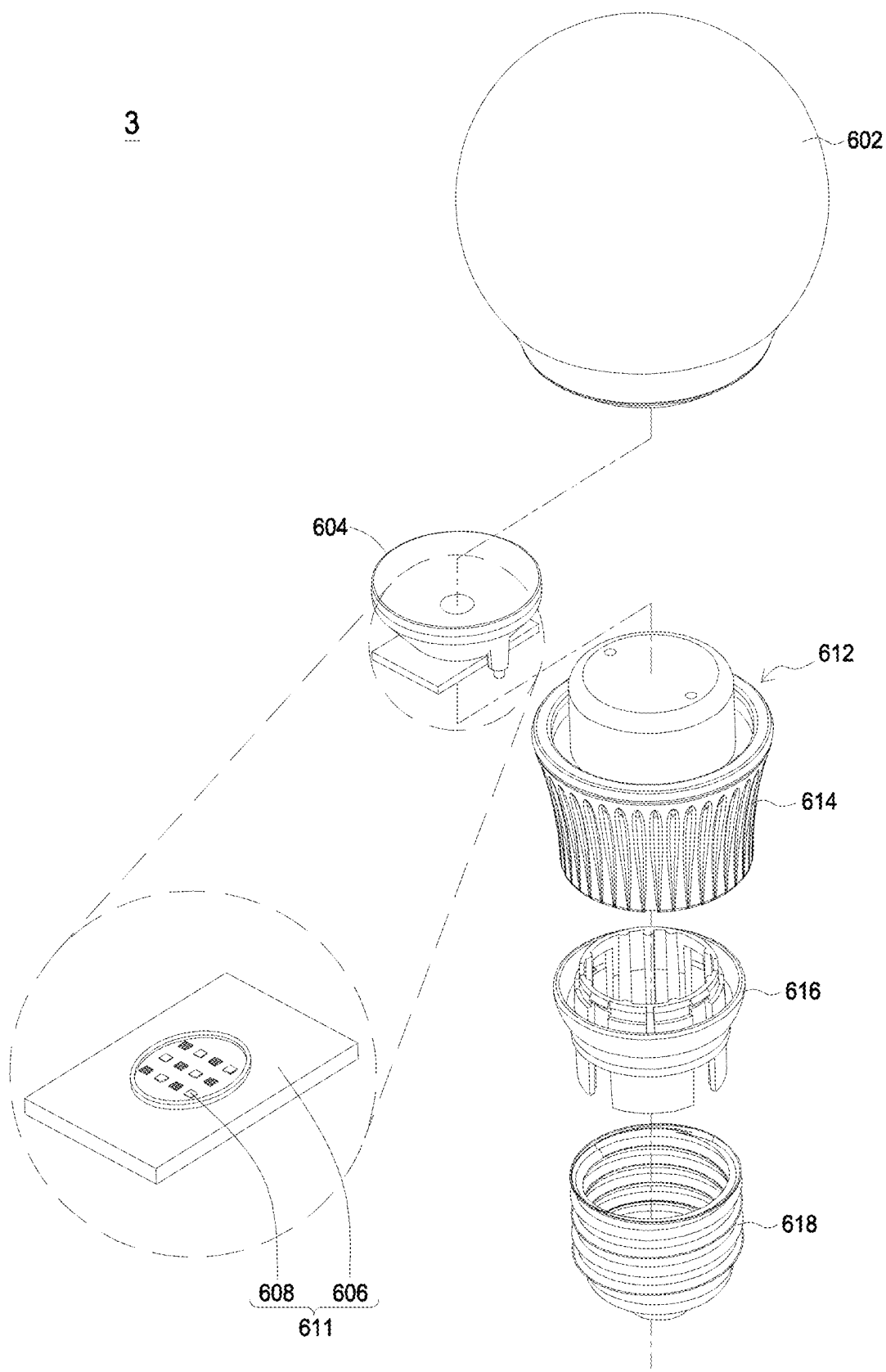
FIG. 9 shows a schematic view of a light emitting apparatus 3 in accordance with an embodiment of the present disclosure.

FIG. 9 is a schematic view of a light emitting apparatus 3 in accordance with one embodiment of the present disclosure. The light emitting apparatus 3 is a bulb comprising a lampshade 602, a reflector 604, a light emitting module 611, a lamp stand 612, a heat sink 614, a connecting portion 616 and an electrical connecting element 618. The light emitting module 611 comprises a bearing portion 606 and light emitting units 608 located on the bearing portion 606, wherein the light emitting units 608 may be the light-emitting device 1 or the light emitting apparatus 2 in the above-mentioned embodiments.

It is noted that each of the embodiments listed in the present application is merely used to describe the present application, not limiting the scope of the present application. It will be apparent to any one that obvious modifications or variations can be made to the devices in accordance with the present disclosure without departing from the spirit and scope of the present application. Identical or similar components in different embodiments or the components having identical reference numerals in different embodiments have identical physical properties or chemical properties. In addition, under suitable circumstances, the above-mentioned embodiments in the present application may be combined or replaced with each other, not limiting to the specific embodiments described above. In one embodiment, the connecting relationship of the specific component and other component described in detail may also be applied into other embodiments, falling within the scope of the following claims and their equivalents of the present application.

What is claimed is:

1. A semiconductor device, comprising:
   a n-type nitride semiconductor structure;
   a stress relief structure on the n-type nitride semiconductor structure comprising a plurality of narrow band gap layers and a plurality of wide band gap layers alternately stacked, wherein one of the plurality of wide band gap layers comprises a first wide band gap sub-layer and a second wide band sub-layer;
   an active structure on the stress relief structure and comprising a plurality of quantum well layers and a plurality of barrier layers alternately stacked, wherein one of the plurality of barrier layers comprises a first barrier sub-layer and a second barrier sub-layer;
   an electron blocking structure on the active structure; and
   a p-type nitride semiconductor structure on the electron blocking structure;
   wherein the first wide band gap sub-layer has a first band gap, the second wide band gap sub-layer has a second band gap, one of the plurality of narrow band gap layers has a third band gap, the first barrier sub-layer has a fourth band gap, and the first band gap is greater than the fourth band gap; and
   wherein both of the first band gap and the second band gap are greater than the third band gap.

2. The semiconductor device according to claim 1, wherein the first wide band gap sub-layer or the second wide band gap sub-layer comprises $Al_xGa_{(1-x)}N$, where $0<x<1$.

3. The semiconductor device according to claim 2, wherein the first wide band gap sub-layer comprises GaN, and the second wide band gap sub-layer comprises $Al_xGa_{(1-x)}N$, where $0<x<1$.

4. The semiconductor device according to claim 3, wherein $x \leq 0.05$.

5. The semiconductor device according to claim 3, wherein the first wide band gap sub-layer or the second wide band gap sub-layer directly contacts the one of the plurality of narrow band gap sub-layers.

6. The semiconductor device according to claim 1, wherein the second barrier sub-layer comprises a fifth band gap, both of the fourth band gap and the fifth band gap are greater than a band gap of one of the plurality of quantum well layers.

7. The semiconductor device according to claim 6, wherein the fourth band gap is greater than the fifth band gap.

8. The semiconductor device according to claim 1, wherein the second barrier sub-layer comprises GaN, and the first barrier sub-layer comprises $Al_{s8}Ga_{(1-s8)}N$, where $0<s8<1$.

9. The semiconductor device according to claim 7, wherein the one of the plurality of barrier layers further comprises a third barrier sub-layer, the third barrier sub-layer comprises GaN.

10. The semiconductor device according to claim 9, wherein the first barrier sub-layer is between the second barrier sub-layer and the third barrier sub-layer.

11. The semiconductor device according to claim 1, wherein the first wide band gap sub-layer comprises a first thickness, the first barrier sub-layer comprises a second thickness, and a first thickness ratio defined by the first thickness to a thickness of the one of the plurality of wide band gap layers is greater than a second thickness ratio defined by the second thickness to another thickness of one of the plurality of barrier layers.

12. The semiconductor device according to claim 1, wherein the one of the plurality of narrow band gap layers comprises $In_{t5}Ga_{(1-t5)}N$, where $0<t5\leq0.1$, and one of the plurality of quantuell layers comprises $In_{t7}Ga_{(1-t7)}N$, where $0.1<t7<0.15$.

13. The semiconductor device according to claim 1, wherein the one of the plurality of barrier layers further comprises a capping layer directly contacting one of the plurality of quantum well layers.

14. The semiconductor device according to claim 13, wherein the capping layer comprises GaN.

15. The semiconductor device according to claim 1, wherein the first wide band gap sub-layer comprises a first aluminum composition, the second wide band gap sub-layer comprises a second aluminum composition, the first barrier sub-layer comprises a third aluminum composition, the second barrier sub-layer comprises a fourth aluminum composition, and one of the first aluminum composition and the second aluminum composition is greater than one of the third aluminum composition and the fourth aluminum composition.

16. The semiconductor device according to claim 1, wherein the first wide band gap sub-layer comprises a first thickness, the second wide band gap sub-layer comprises a second thickness, the one of the plurality of wide band gap layers comprises a third wide band gap sub- layer comprising a third thickness, a sum of thickness of the first thickness and the second thickness is greater than the third thickness.

17. The semiconductor device according to claim 1, wherein the one of the plurality of wide band gap layers comprises a first average aluminum composition, the one of the plurality of barrier layers comprises a second average aluminum composition, and the first average aluminum composition is greater than the second average aluminum composition.

18. The semiconductor device according to claim 17, wherein the electron blocking structure comprises a third average aluminum composition, and the third average aluminum composition is greater than the first average aluminum composition.

19. The semiconductor device according to claim 1, wherein the plurality of barrier layers further comprises a final barrier layer closest to the electron blocking structure, and the final barrier layer comprises $Al_{s9}In_9Ga_{(1-19)}N$, where $0<s9<1$, $0<t9<1$.

20. The semiconductor device according to claim 1, wherein $0.002<t9<0.02$.

* * * * *